(12) United States Patent
Gieselmann et al.

(10) Patent No.: US 11,757,270 B2
(45) Date of Patent: Sep. 12, 2023

(54) WORKSTATION WITH CABLE MANAGEMENT SYSTEM

(71) Applicant: e.ventures Management LLC, San Francisco, CA (US)

(72) Inventors: Thomas Gieselmann, San Francisco, CA (US); Nicholas Wood Allen, San Francisco, CA (US)

(73) Assignee: e.ventures Management LLC, San Francisco, CA (US)

( * ) Notice: Subject to any disclaimer, the term of this patent is extended or adjusted under 35 U.S.C. 154(b) by 101 days.

(21) Appl. No.: 17/153,302

(22) Filed: Jan. 20, 2021

(65) Prior Publication Data

US 2021/0226430 A1 Jul. 22, 2021

Related U.S. Application Data

(60) Provisional application No. 62/964,600, filed on Jan. 22, 2020.

(51) Int. Cl.
| | |
|---|---|
| *H02G 3/32* | (2006.01) |
| *H02G 3/12* | (2006.01) |
| *H02G 3/10* | (2006.01) |
| *H05K 7/14* | (2006.01) |

(52) U.S. Cl.
CPC ............. *H02G 3/128* (2013.01); *H02G 3/105* (2013.01); *H02G 3/32* (2013.01); *H05K 7/1447* (2013.01)

(58) Field of Classification Search
CPC .......... H02G 3/128; H02G 3/105; H02G 3/32; H05K 7/1447

USPC .......................................................... 174/50
See application file for complete search history.

(56) References Cited

U.S. PATENT DOCUMENTS

| | | | |
|---|---|---|---|
| 10,480,686 B2* | 11/2019 | Herbert .................... | H02G 3/32 |
| 2007/0149066 A1* | 6/2007 | Shi ........................... | H02G 3/32 |
| | | | 439/752 |
| 2007/0155225 A1* | 7/2007 | Shi ........................... | H02G 3/32 |
| | | | 439/501 |
| 2009/0113699 A1* | 5/2009 | Chi ....................... | H01R 13/595 |
| | | | 29/748 |
| 2010/0096960 A1* | 4/2010 | Lee ......................... | A47B 21/00 |
| | | | 312/194 |
| 2019/0113156 A1* | 4/2019 | Herbert ..................... | F16L 3/13 |

* cited by examiner

*Primary Examiner* — Timothy J Thompson
*Assistant Examiner* — Michael F McAllister
(74) *Attorney, Agent, or Firm* — Cognition IP, P.C.; Edward Steakley

(57) ABSTRACT

A cable management apparatus can include a first surface configured for working and a second surface having a channel integrally formed into the apparatus material at the second surface. The channel can have sidewalls, extend longitudinally in a direction parallel to the second surface, have a longitudinal channel opening at the second surface along a substantial portion of the channel, and can be configured to hold a cable therein even when the channel opening faces downward. The cable may be curved within the channel to create elastic potential energy in the cable, and a friction force between the curved cable pushing against the channel sidewalls can hold the cable in place within the channel. The channel may form a cross-section having an undercut that is defined by ledge portions at the channel opening, and the ledge portions can hold the cable in place within the channel.

20 Claims, 18 Drawing Sheets

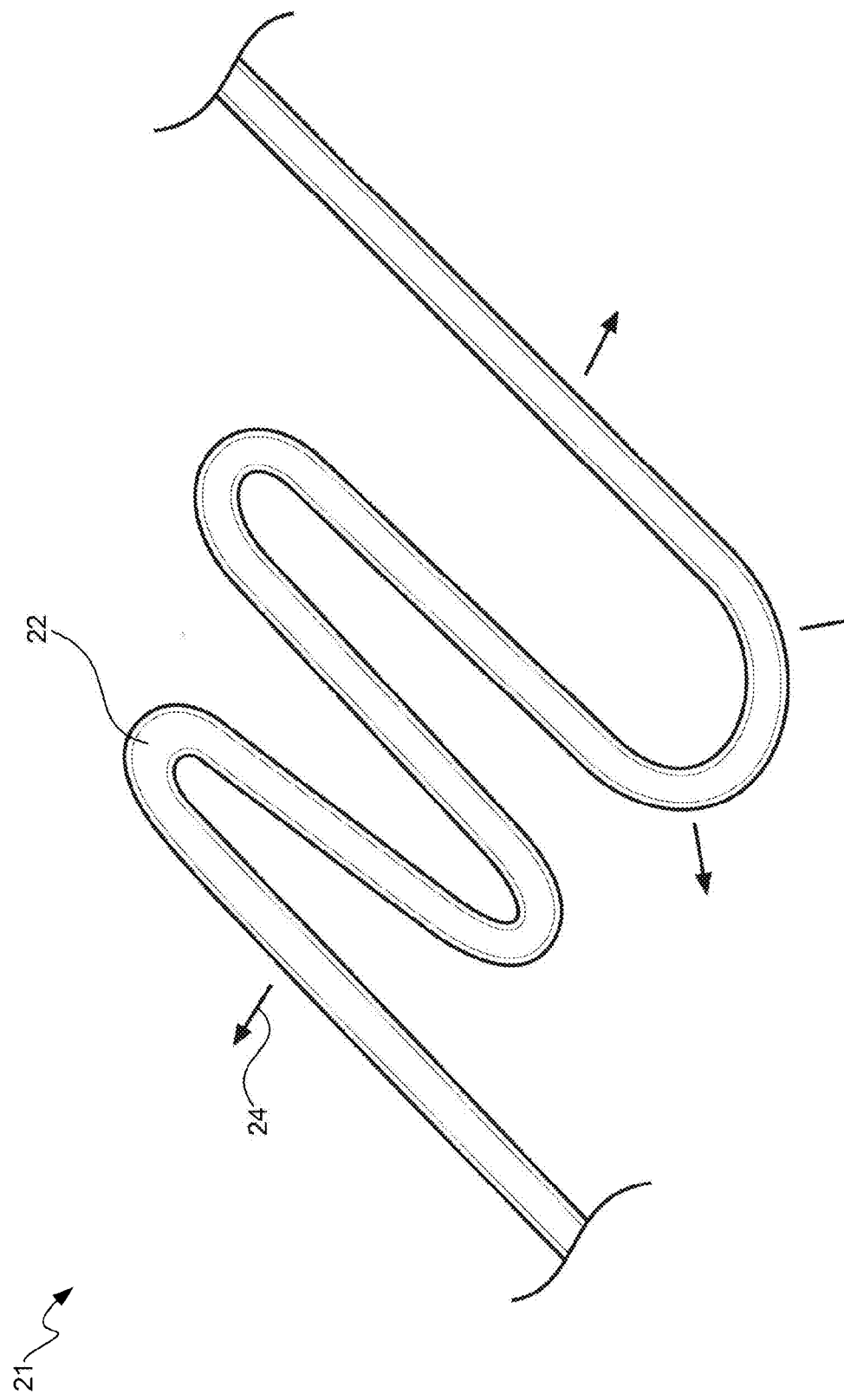

WORKSTATION WITH CABLE MANAGEMENT SYSTEM

CROSS-REFERENCE TO RELATED APPLICATION

This application claims priority to U.S. Provisional Application No. 62/964,600, filed Jan. 22, 2020, which application is hereby incorporated by reference in its entirety.

TECHNICAL FIELD

The present disclosure relates generally to managing cables, and more particularly to managing cables at desks, workstations, and other working environments.

BACKGROUND

Many working environments utilize cords or cables to provide power, communications, or both between items. Such cables are commonly found at desks, tables, and workstations, and other places can include server rooms and even industrial and construction environments. It is typically undesirable for cables to be located on a desktop, table, or other working surface, and for these cables to be moved out of the way as much as possible. This can result in cables simply being dropped over the edge of a desk between the desk and a wall, although this solution may not be practical in all situations. The rising popularity of standing desks and adjustable height desks can also result in this being mostly unworkable.

Other possibilities for managing cables, which may include workstation cables as well as large construction and other industrial power cables, can include various aftermarket solutions. These solutions can involve gravity-based features, such as collecting or resting cables into boxes or baskets, fastener-based features to hold cables in place, such as clamps, clips, zip ties, glue, and the like, and coil-based features that involve wrapping cables around one or more objects. Of course, such aftermarket products are less preferable than having these issues solved by a desk, shelf, or other item itself. Some cable management solutions can include features that are included with a desk or other item, such as cable routing holes drilled all the way through a desk from the top to bottom surfaces. Many of these solutions can be cumbersome to work with though and may not be aesthetically pleasing for various reasons.

Although traditional ways of managing cables have worked well in the past, improvements are always helpful. In particular, what is desired are reliable cable management systems that are easy to use and that present an improved aesthetically pleasing result.

SUMMARY

It is an advantage of the present disclosure to provide reliable cable management systems that are easy to use and that present a more aesthetically pleasing result in comparison with existing cable management systems. The disclosed features, apparatuses, systems, and methods provide improved cable management solutions that involve items having integrally formed channels that route and hold cables reliably within the items regardless of item orientation and in a manner that is easy to implement. These advantages can be accomplished in multiple ways, such as by utilizing the elastic potential energy contained within cables that are curved within the integrally formed channels to hold the cables within the channels due to friction forces between the curved cable portions and sidewalls of the channels.

In various embodiments of the present disclosure, an apparatus can include a first surface configured for working and a separate second surface having a channel integrally formed into the apparatus material at the second surface. The channel can have sidewalls that extend longitudinally in a direction that is parallel to the second surface and can also have a longitudinal channel opening at the second surface along a substantial portion of the channel. The channel can also be configured to hold a cable therein even while the channel opening faces downward without the cable falling out due to gravity, with the cable having a diameter that is less than the width of the channel opening.

In various detailed embodiments, friction force between the cable and the channel sidewalls holds the cable in place within the channel. The cable can be curved within the channel and the friction force can result from elastic potential energy in the curved cable pushing the cable outward against one or more channel sidewalls. This can occur where the channel has at least one curved portion and/or changes direction multiple times along its length. In further detailed embodiments, the channel can form a cross-section having an undercut that is defined by ledge portions at the channel opening, and the cable can be held in the channel at least in part by the ledge portions. The channel can also have a bottom at a depth from the second surface that is less than the thickness of the apparatus at the location of the channel. The first surface of the apparatus can be a top surface and can be substantially flat and unbroken, while the second surface can be a bottom surface opposite the top surface. In various embodiments, the apparatus can be at least a portion of a desk, table, workstation, or other component within a working environment.

In various further embodiments of the present disclosure, an apparatus can include a working surface and a separate second surface having a plurality of channels integrally formed into the apparatus material at the second surface. Each of the plurality of channels can have sidewalls and a channel opening at the second surface along a substantial portion of the channel, and the plurality of channels can be configured to hold simultaneously a plurality of cables therein. In detailed embodiments, the plurality of channels can intersect at a plurality of channel intersections, and there can be at least one hundred possible paths for a single cable to traverse through the plurality of channels. A plurality of individual notches can combine to form the plurality of channels, where each of the plurality of individual notches can define an upper region having a first width and a lower region having a second width that is less than the first width. The lower regions of the individual notches can form the channel sidewalls, while the upper regions of the notches form ledge portions at the channel openings. Each cable can be held in the plurality of channels at least in part by the ledge portions, at least in part by friction forces between the cable and the channel sidewalls, or both.

Other apparatuses, methods, features, and advantages of the disclosure will be or will become apparent to one with skill in the art upon examination of the following figures and detailed description. It is intended that all such additional apparatuses, methods, features and advantages be included within this description, be within the scope of the disclosure, and be protected by the accompanying claims.

BRIEF DESCRIPTION OF THE DRAWINGS

The included drawings are for illustrative purposes and serve only to provide examples of possible structures and arrangements for the disclosed apparatuses, systems and methods for managing cables. These drawings in no way limit any changes in form and detail that may be made to the disclosure by one skilled in the art without departing from the spirit and scope of the disclosure.

FIG. 3A illustrates in top plan view an exemplary cable arranged in a curving configuration resulting in elastic potential energy according to one embodiment of the present disclosure.

DETAILED DESCRIPTION

Figure 1A:
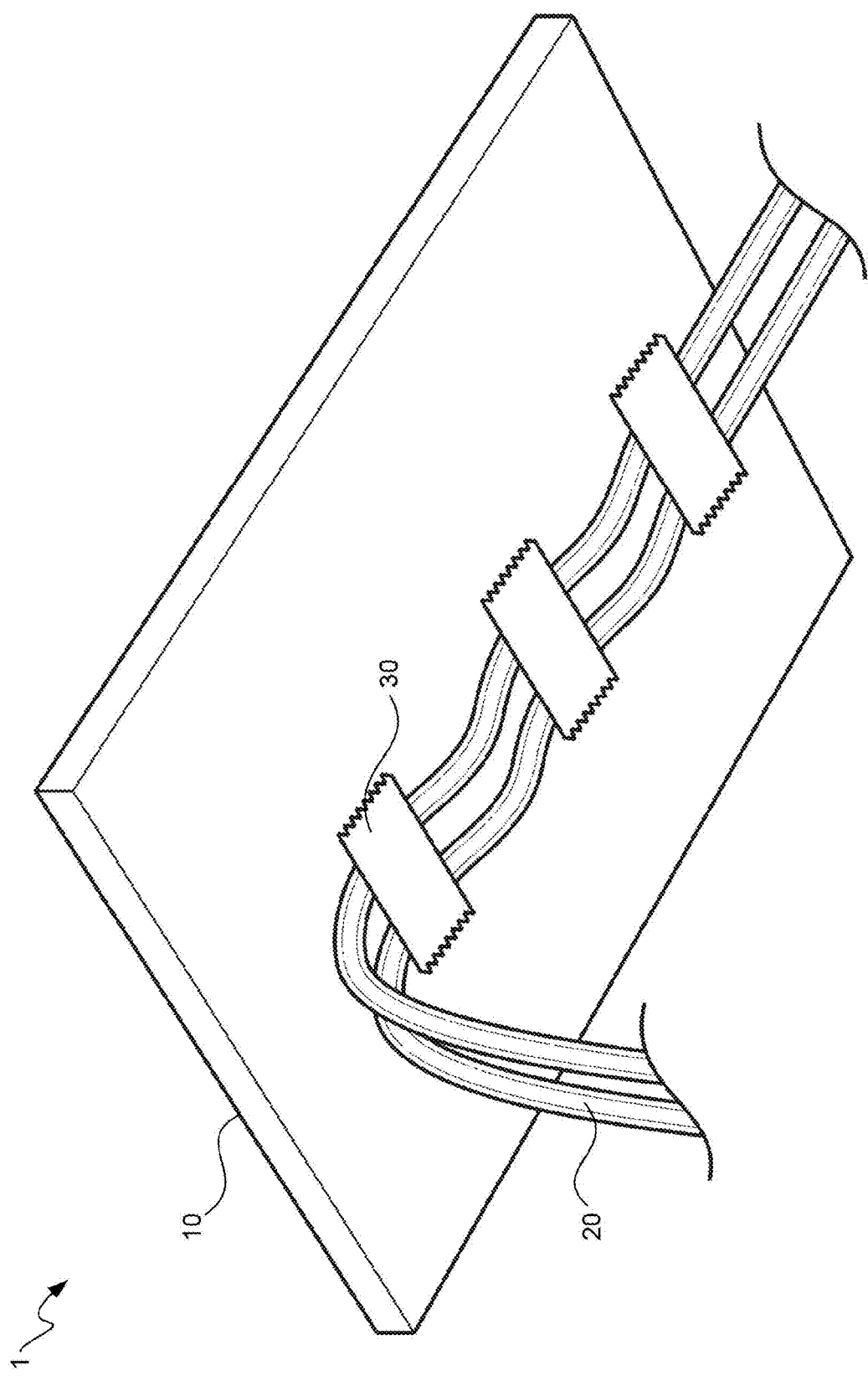
FIG. 1A illustrates in bottom perspective view an exemplary workstation portion with cables taped thereto.

Exemplary applications of apparatuses, systems, and methods according to the present disclosure are described in this section. These examples are being provided solely to add context and aid in the understanding of the disclosure. It will thus be apparent to one skilled in the art that the present disclosure may be practiced without some or all of these specific details provided herein. In some instances, well known process steps have not been described in detail in order to avoid unnecessarily obscuring the present disclosure. Other applications are possible, such that the following examples should not be taken as limiting. In the following detailed description, references are made to the accompanying drawings, which form a part of the description and in which are shown, by way of illustration, specific embodiments of the present disclosure. Although these embodiments are described in sufficient detail to enable one skilled in the art to practice the disclosure, it is understood that these examples are not limiting, such that other embodiments may be used, and changes may be made without departing from the spirit and scope of the disclosure.

The present disclosure relates in various embodiments to features, apparatuses, systems, and methods for managing cables. Such cable management can be at a desk, table, workstation, or any other pertinent item within a working environment. The disclosed embodiments can be integrated into a relevant item, are reliable and easy to use, and present a more aesthetically pleasing result in comparison with existing cable management systems. In particular, the disclosed embodiments can utilize channels that are integrally formed within material at a surface of a desk, workstation or other item, such as at surface on the underside of a desk that is opposite a top, flat, working surface of the desk.

Various ways of routing and holding cables within such integrally formed channels can be used. For example, cables can be held within these channels by utilizing the elastic potential energy that is contained within cables that have been curved. The elastic potential energy in curved cables attempting to return to a less curved state then results in friction forces between the curved cable portions and sidewalls of the channels, which friction forces then hold the cables within the channels regardless of channel orientation. Alternatively, or in addition to taking advantage of frictional forces resulting from elastic potential energy, cables can also be held within these channels by way of ledges that are part of undercut profiles for at least some of the integrally formed channels.

Although various embodiments disclosed herein discuss channels that are integrally formed at a bottom surface of a desk or workstation for purposes of simplicity in illustration, it will be readily appreciated that the disclosed features, apparatuses, systems, and methods can similarly be used for any relevant surface at any item within any working environment, such as a piece of furniture, shelf, scaffold, panel, wall, or the like. For example, the working surface of a relevant item may be at other locations, such as adjacent to or near the surface having channels integrally formed therein. Channels adapted for managing cables may be integrally formed at a side surface of a portable desk or lap workstation, for example. In other applications, channels adapted for managing heavy power cables, such as for industrial or construction purposes, can be integrally formed into movable furniture items, shelves, scaffolding, panels, walls, and other relevant items. Other applications, arrangements, and extrapolations beyond the illustrated embodiments are also contemplated.

In various detailed examples, which are merely illustrative and non-limiting in nature, a desk, workstation, furniture component, shelf, scaffold, panel, wall or other item having cables to manage can include some variation of the disclosed cable management systems. Specifically, these systems can include channels that are integrally formed within a portion of the material of a relevant item. In addition to the built-in convenience of such systems that eliminates the need for any extra or aftermarket products, other pertinent features can include the integrally formed channels having geometries that facilitate the easy installation and removal of cables, as well as the ability to hold installed cables in place regardless of the channel orientation. This can be particularly useful in allowing the cable management system to be located out of normal sight, such as at the underside of a desk.

Referring first to FIG. 1A, an exemplary workstation portion with cables taped thereto is illustrated in bottom perspective view. Workstation arrangement 1 can involve, for example, a desk, table, or other item where cables are commonly used. Workstation portion 10 can be all or part of an upper component of the workstation and can include an upper surface (not shown) configured to support cable using devices, such as phones, computer monitors, keyboards, charging stations, and the like. A set of cables 20 for these devices can be secured to a bottom surface of workstation portion 10 by way of pieces of tape 30 or other fasteners. Although workstation arrangement 1 keeps the cables 20 out of the way of the upper working surface of workstation portion 10, as shown, this can be a rather crude and unsightly way of accomplishing this result.

Figure 1B:
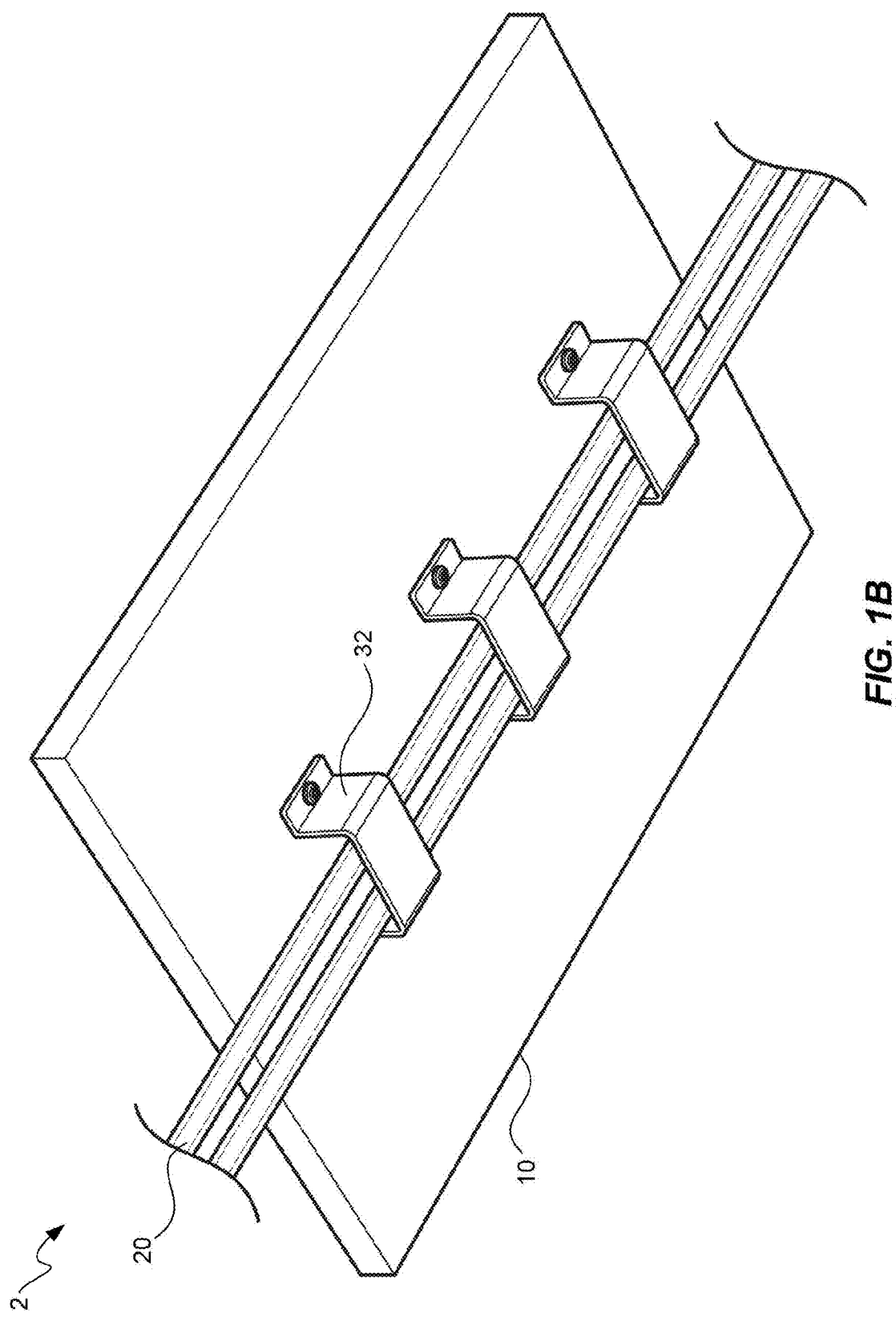
FIG. 1B illustrates in bottom perspective view an exemplary workstation portion with cables bracketed thereto.

FIG. 1B illustrates in bottom perspective view an exemplary workstation portion with cables bracketed thereto. Workstation arrangement 2 can involve the same workstation portion 10 and set of cables 20 as in the previous example. Rather than use tape, however, cables 20 can be held at the bottom surface of workstation portion 10 by way of brackets 32 that are affixed to the workstation portion 10. Although workstation arrangement 2 may be better than the previous workstation arrangement 1, it still uses additional aftermarket items, and may be considered inconvenient to use and unsightly.

Figure 2:
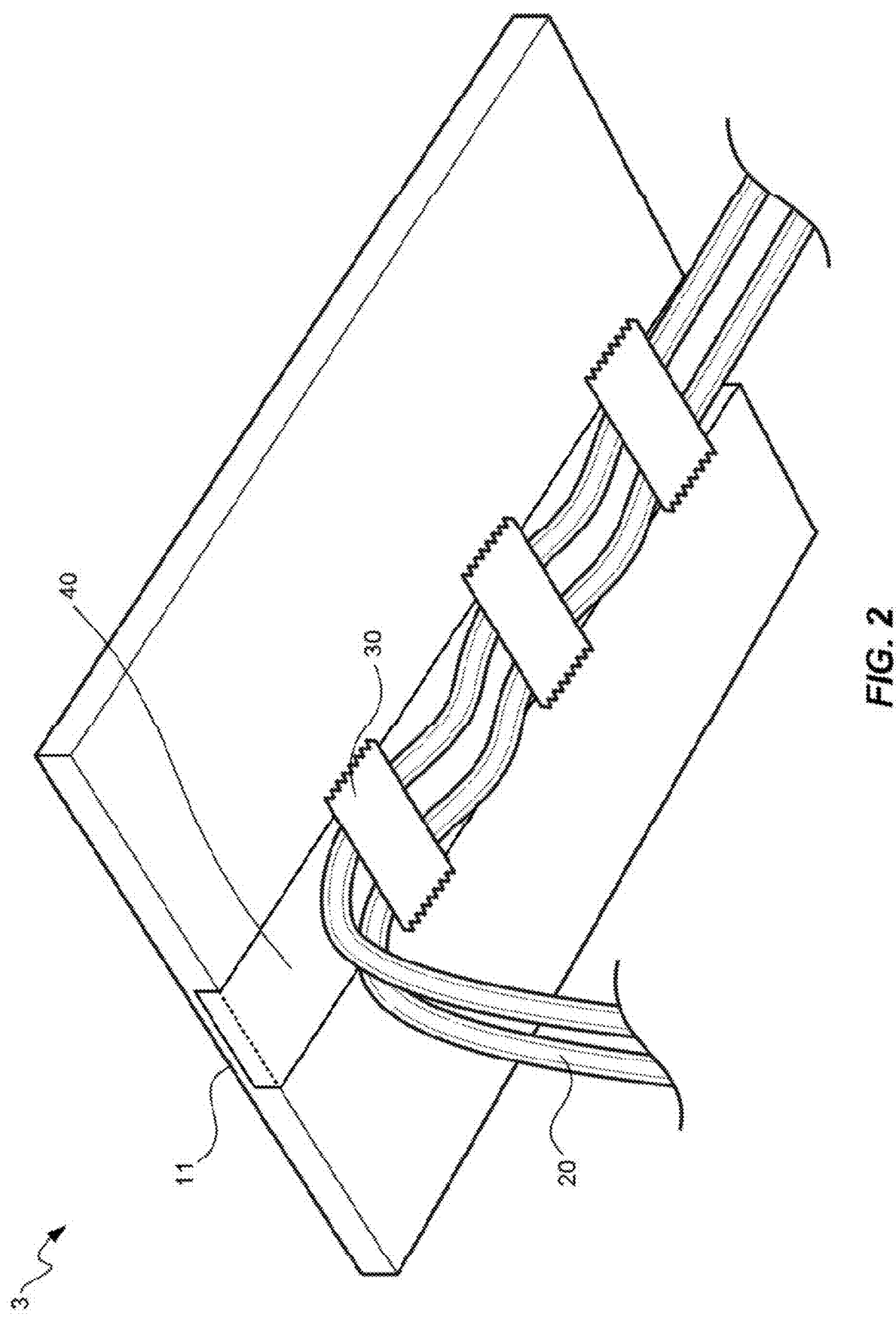
FIG. 2 illustrates in bottom perspective view an exemplary workstation portion with cables taped within a channel thereof according to one embodiment of the present disclosure.

Moving next to FIG. 2, exemplary workstation portions are shown with cables taped within a channel and bracketed within a channel respectively. FIG. 2 depicts a workstation arrangement 3 that is similar to workstation arrangement 1 above, in that it includes a workstation portion 11 having a set of cables 20 secured to a bottom surface thereof using pieces of tape 30 or other similar fasteners. Workstation portion 11 is different in that it includes a straight channel 40 that is integrally formed within the material of the workstation at the bottom surface. Channel 40 serves to help keep the cables 20 in place at a desired location along the bottom of the workstation portion 11, but the pieces of tape 30 are still needed to keep the cables 20 from falling out of the channel 40.

Another workstation arrangement 4 (not shown), combining features of workstation arrangement 2 and 3 above, may include a workstation portion 11 having a set of cables 20 secured to a bottom surface thereof using brackets 32 that are affixed to the workstation portion 11. Again, workstation portion 11 may include a straight channel that is integrally formed within the workstation material, and this channel can serve to keep the cables 20 in place at a desired location at the underside of the workstation. Similar to the previous workstation arrangement 3 including an integrally formed channel, the brackets 32 are still needed to keep the cables from falling out of the channel 40. Workstation arrangements 3 and 4 may be somewhat better than the previous workstation arrangements 1 and 2 in that they may be more aesthetically pleasing, but they still require the use of tape, brackets, or other fasteners to keep the cables in place against the workstation component.

Figure 3B:
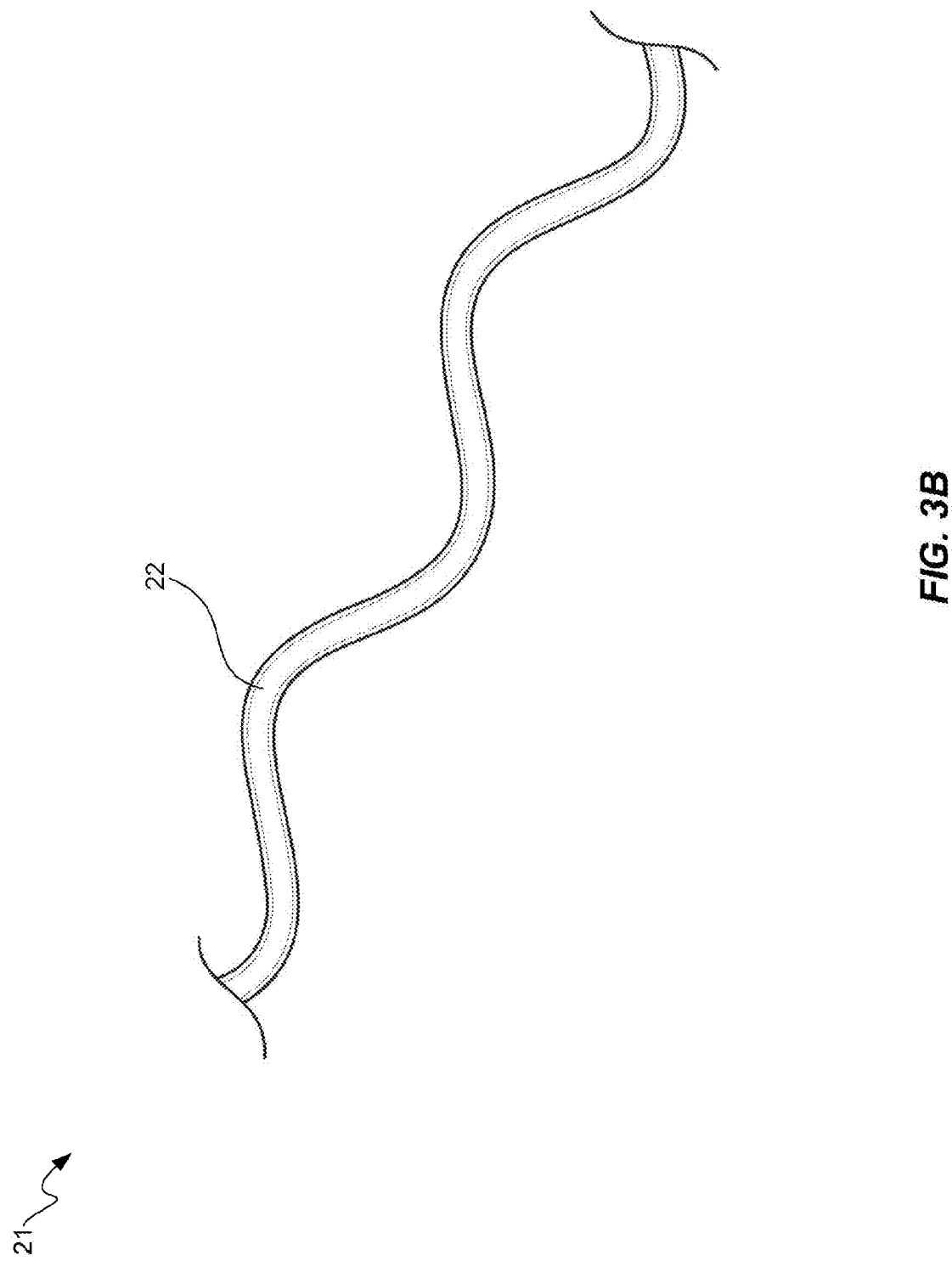
FIG. 3B illustrates in top plan view another exemplary cable arranged in a curving configuration resulting in elastic potential energy according to one embodiment of the present disclosure.

Moving to FIGS. 3A-3B, an exemplary cable arranged in a curving configuration resulting in elastic potential energy is illustrated in top plan view. As shown in both FIGS. 3A and 3B, cable 21 is set in a configuration having multiple curves 22 along the length of the cable. This kind of configuration can be easily accomplished, such as through the manual manipulation of a typical power or communication cable. At various curves 22 along the length of cable 21, some amount of energy or force 24 can be observed as the cable tends to want to return to a straightened or less curved state. It is generally well known that elastic potential energy is the potential mechanical energy stored in the configuration of a material or physical system as work is performed to distort its volume or shape. Elastic potential energy, occurs when objects are compressed, stretched, or generally deformed in any manner. As such, power cords, monitor cables, phone charging cords, and the like contain some amount of elastic potential energy that is experienced when these cables are curved. The tighter that a cable is curved, the more elastic energy is built up in the cable, such that an amount of reactive force is given out by the cable as it tries to expand and return to a straighter state. At a sufficient amount of curvature, this elastic energy forces a cable outward enough to push a curved cable with force against whatever is making the cable curve. Additionally, although the cable 21 in FIG. 3B does not experience as much curvature as that of the cable 21 in FIG. 3A, the cable 21 in FIG. 3B will still experience elastic potential energy, and some amount of energy or force 24 can be observed as the cable wants to return to a straightened or less curved state, even if the energy or force is less. In this description, a cable or wire can be configured in a curved position, from its resting position, by bending the cable, such that the curved cable would naturally want to return to its original state of curvature prior to bending the cable. For example, a straight cable that is bent to a curved position, due to its elastic potential energy, may naturally form into a straight position. An originally and permanently curved cable, such as a cable permanently curved into a plurality of circles (e.g. for better storage or physical handling), when bent, due to its elastic potential energy, may naturally form back into its originally curved position. Specifically, a bent cable from a straight configuration to a curved position, or from a resting curved position to a differently configured curved position, can experience compression on one side of the cable and tension, or a stretched or extended configuration, on the other side of the cable. The compressed portion of the cable is experiencing force to expand the cable back to a straight configuration and the stretched portion of the cable experiences tension force to return to an uncompressed state, such as having the cable straight. In this example, a straight cable bent in a curved position and placed in a narrow enough channel, such that the curved cable will naturally experience compression and tension to return to a straight cable configuration, will have one or more portions of the cable pushed against walls of the channel.

Rather than tape, brackets, or other fasteners, this force resulting from elastic potential energy can be used to help hold a cable in place. In the case of a curved channel that is integrally formed within the material of a desk, workstation, or other relevant component, it can be the sidewalls of the curved channel that are forcing a cable to curve. Where the channel is curved enough, the outward force of the cable trying to expand and return to a straighter state can push against the channel sidewalls to create enough frictional force between the cable and the channel sidewalls to hold the cable in place. This use of elastic potential energy stored in the cable itself is one way to hold a cable in place within an integrally formed channel that does not require the use of any fasteners or additional items.

Figure 4:
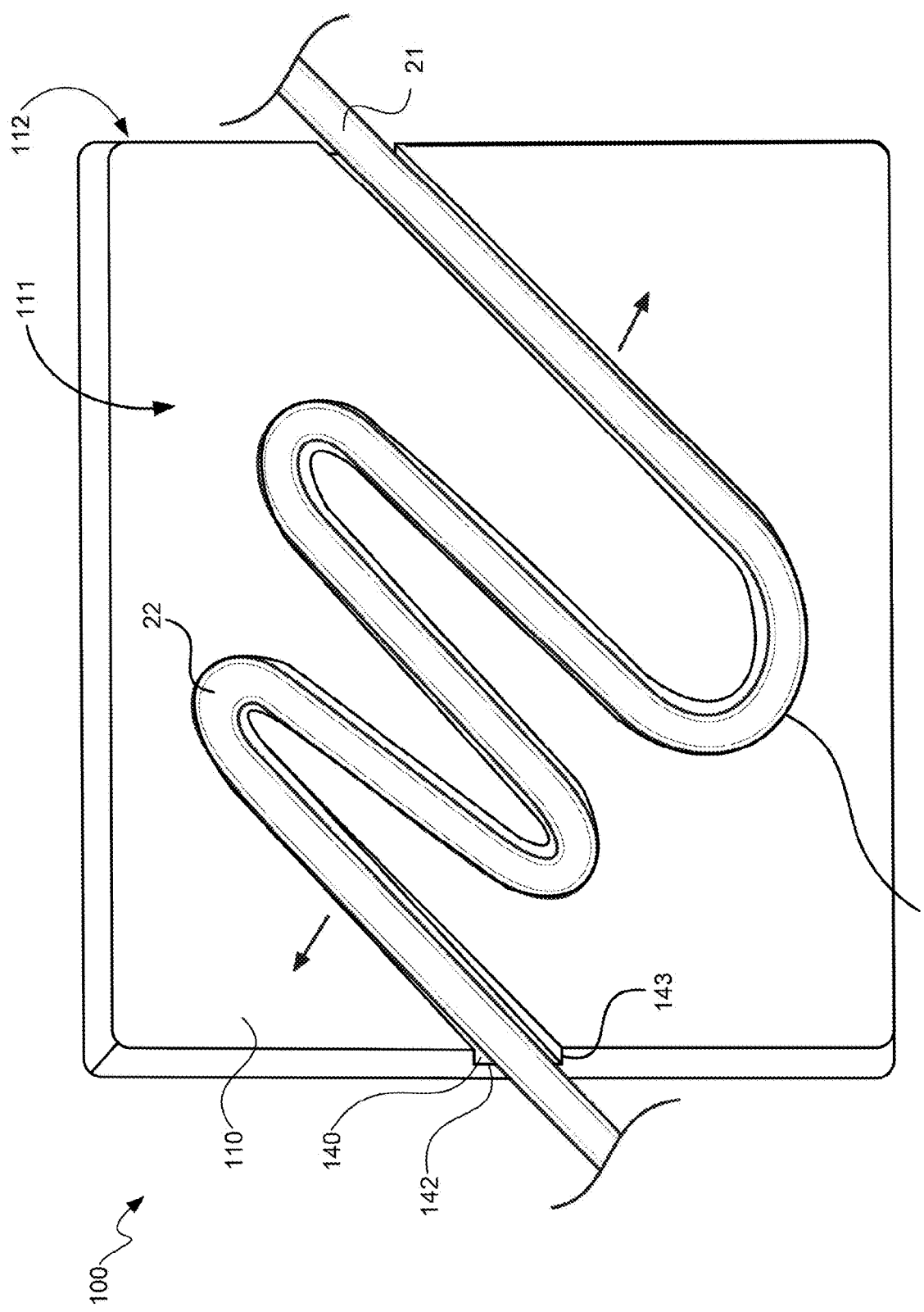
FIG. 4 illustrates in top perspective view an exemplary workstation portion having a curving channel and a curving cable held therein by friction forces according to one embodiment of the present disclosure.

Turning next to FIG. 4, an exemplary workstation portion having a curving channel and a curving cable held therein by friction forces is shown in top perspective view. Workstation arrangement 100 can include a workstation portion 110 that may be part of a desk, table, or other relevant item within a working environment where cables are typically used. A curving channel 140 having multiple curved regions 141 can be integrally formed in the material of workstation portion 110 along one surface 111 that can be opposite a working surface 112 that is substantially flat and unbroken. As shown, integrally formed curving channel 140 can extend longitudinally through workstation portion 110 in a direction that is parallel to surface 111, can change direction multiple times along a length of the channel, and can have a bottom 142 at a depth from surface 111 that is less than the thickness of the workstation portion 110 at the location of the channel 140. The channel 140 can also have substantially vertical sidewalls 143 and can be open at surface 111 to form a longitudinal opening along the channel 140.

Cable 21 can be placed within the channel 140 such that the cable extends along some or all of the length of the channel. This can be accomplished by, for example, manually manipulating the cable 21 to conform to the curving shape of the channel 140 while inserting the cable into the channel along its opening at surface 111. As noted above, forcing the cable 21 to curve results in some amount of energy or force at the curved regions 141 where the cable has elastic potential energy and is inclined to return to a straightened or less curved stated. At these curved regions 141, the cable 21 presses up against the sidewalls 143 of the channel 140 along the outer portion of the curve as its elastic potential energy attempts to straighten the cable. This results in a friction force between the cable 21 and the sidewalls 143 of the channel 140 at the curved regions 141 in the channel, and the cable is then held in place within the channel by this friction force regardless of the orientation of the workstation portion 110. Surface 111 can be facing downward and working surface 112 can be facing upward, for example, and cable 21 will remain held within the channel due to these friction forces with the channel sidewalls 143 at curved regions 141.

Although channel 140 has several curved regions 141, it will be appreciated that the same effect of creating friction forces between a curved cable and channel sidewalls can alternatively be achieved by forcing a cable to curve through a channel having only straight portions but corners or directional changes along the length of the channel. While the exemplary workstation portion 110 and integrally formed curving channel 140 of FIG. 4 have been shown for purposes of illustration and discussion, it will be appreciated that dimensions for the widths, depths, curvatures, and number of curves or directional changes for similar channels can vary depending on design considerations and the types and sizes of cables that are intended to be held within a given workstation portion. For example, the size and shape of a channel designed for a power cable may be different than the size and shape of a channel designed for a phone charging cable.

In general, curvature at any given point on a curve can be expressed as:

$$K=1/r$$

where K is the curvature and r is the radius of a circle at that given point on the curve with a curvature that matches that point. This r can also be referred to as the radius of curvature. Units for K then can be 1/cm (i.e., $cm^{-1}$), or any other amount of distance. As will be appreciated, the curvature value K will change along a curve unless the curve is a perfect circle and will be at its largest amount at the point of greatest curvature, which is typically the apex of curve. The value for K will be larger for tighter curves (i.e., small "r"), smaller for gradual curves (i.e., large "r"), and 0 for a straight line (i.e., infinite "r").

An optimal or even preferable amount of curvature or number and spacing of directional changes for a given channel can be determined based on the size and type of cable that the channel is intended to support. A greater curvature K and/or more directional changes may be optimal for channels for a smaller cable such as a phone charging cable, while a smaller curvature K and fewer directional changes may be optimal for channels for a larger cable, such as a power cable or monitor cable. The amount of curvature or number and spacing of directional changes for a channel should reflect that which is sufficient to generate enough elastic potential energy in a curved version of that type of cable so as to result in enough frictional force between the curved cable and the channel sidewalls to support the cable during an ordinary installation of the cable within the channel.

As non-limiting examples, a curvature K of about 0.5 $cm^{-1}$ to 2.0 $cm^{-1}$ is thought to be suitable for a phone charging cable having a diameter of 0.4 cm, while a curvature K of about of about 0.2 $cm^{-1}$ to 1.0 $cm^{-1}$ is thought to be suitable for a power cable having a diameter of 1.0 cm. Although there will be different types and exceptions, many cables will experience a suitable amount of elastic potential energy when curved at a curvature K reflecting a radius of curvature r that is equal to or greater than four times the diameter of the cable. Smaller radii of curvatures will result in greater amounts of curvature K and greater amounts of elastic energy in cables, and at some point the curvature will become too great for a cable to handle without becoming warped or damaged. It is specifically contemplated though that the amounts of curvature and directional changes for channels intended to support each type and size of cable can be determined by way of routine experimentation.

Figure 5A:
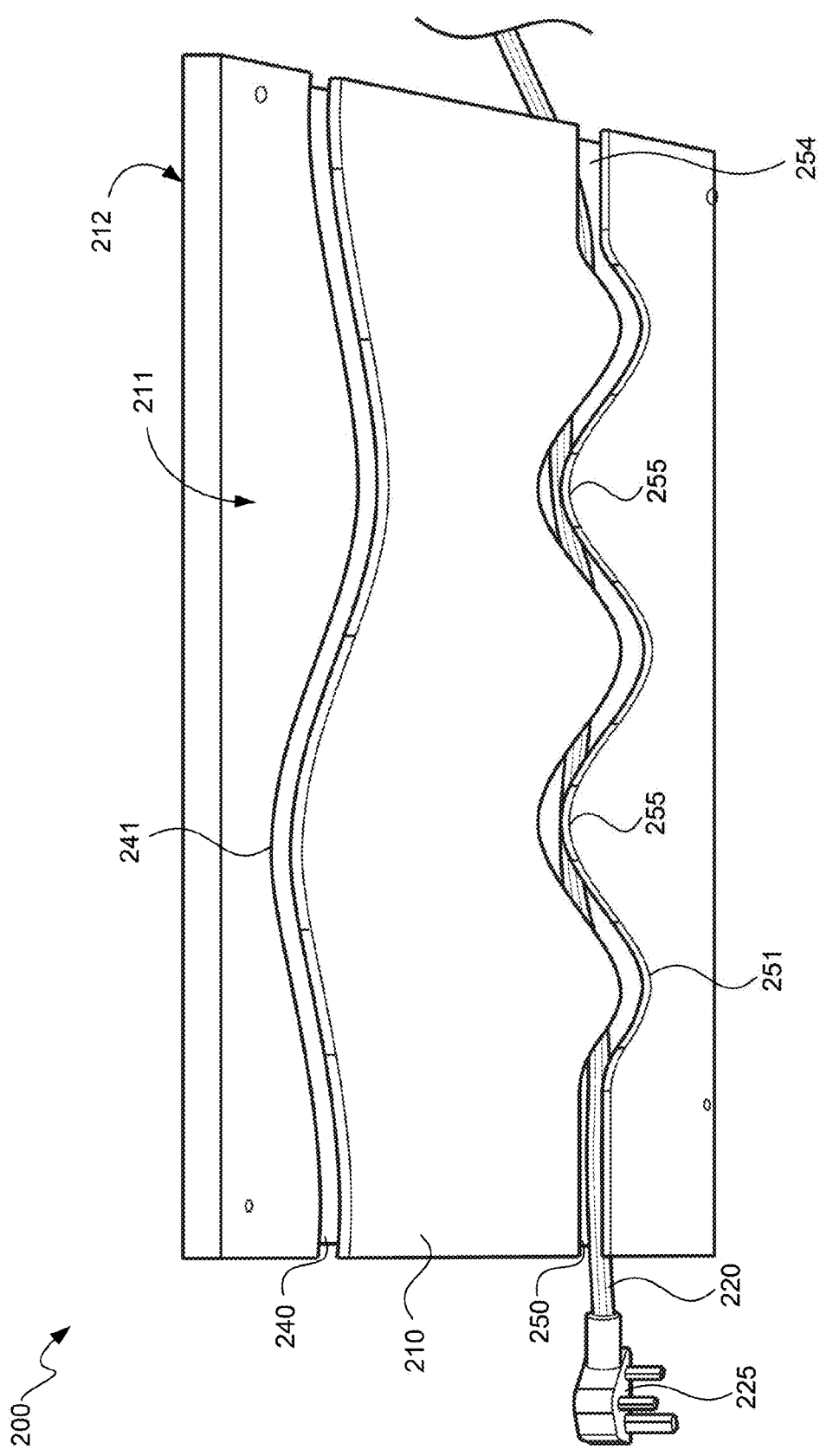
FIG. 5A illustrates in bottom perspective view an exemplary workstation portion having a curving channel with an undercut and a cable held therein by undercut ledges according to one embodiment of the present disclosure.
Figure 5B:
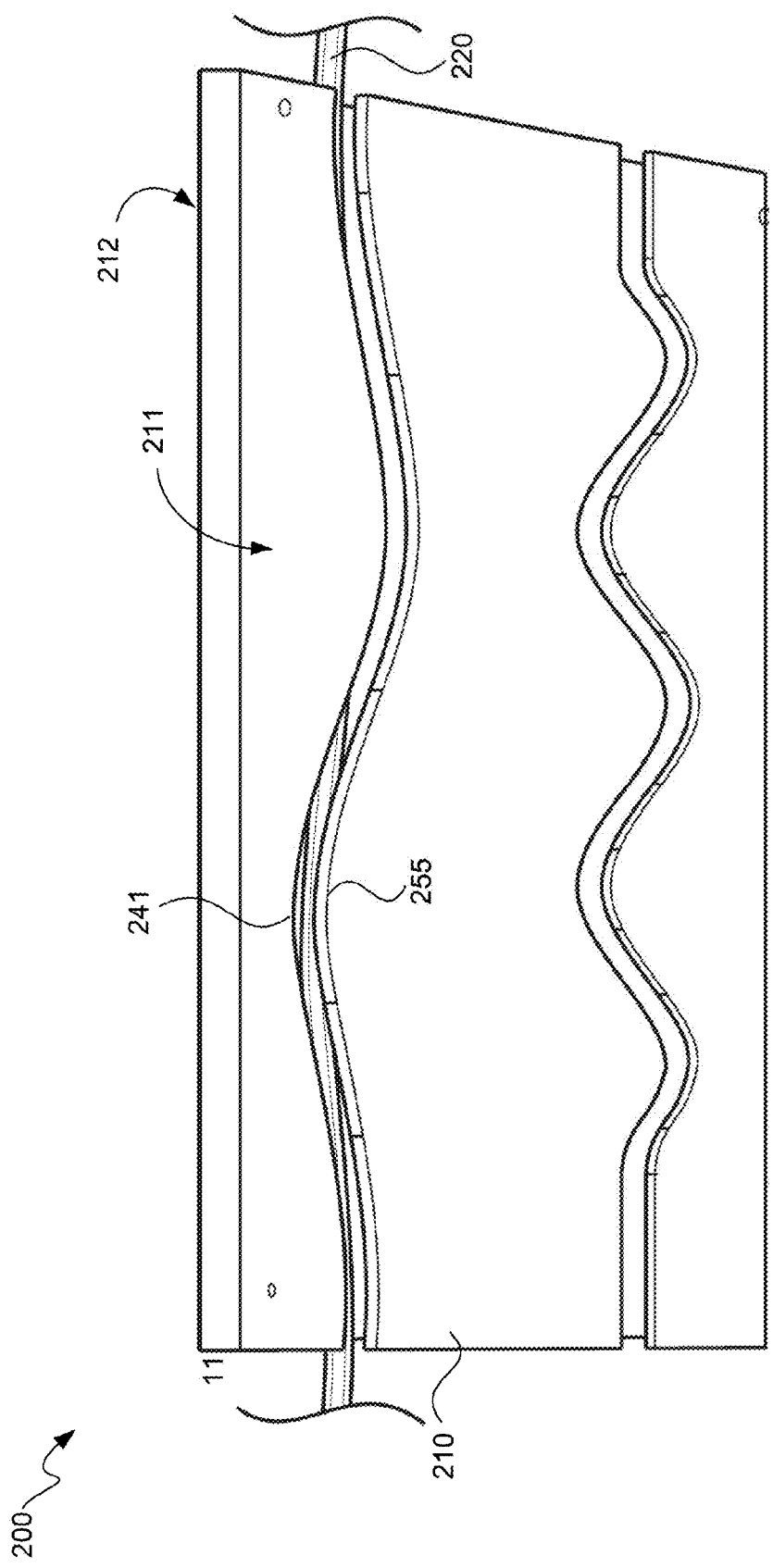
FIG. 5B illustrates in bottom perspective view an exemplary workstation portion having a curving channel with an undercut and a cable held therein by undercut ledges according to one embodiment of the present disclosure.

Another way to support cables within integrally formed channels can involve the use of channels with more complex geometries than the simple vertical sidewall and bottom channels illustrated to this point. Turning next to FIGS. 5A and 5B, FIG. 5A illustrates an exemplary workstation portion having a curving channel with an undercut and a cable held therein by undercut ledges is illustrated in bottom perspective view. Workstation arrangement 200 can include a workstation portion 210 that can form some or all of a tabletop component for a desk, table, furniture component, or other relevant item having a need to manage associated cables. A first curving channel 240 having multiple curved regions 241 can be integrally formed in the material of workstation portion 210 along one surface 211 that can be opposite a working surface 212 that is substantially flat and unbroken. In some cases, working surface 212 can be arranged to face upward while surface 211 faces downward during use of workstation portion 210.

A second curving channel 250 having multiple curved regions 251 can also be integrally formed in the material of workstation portion 210 at surface 211. Each of channels 240 and 250 can extend longitudinally through workstation portion 210 in a direction that is parallel to surface 211, can change direction multiple times along a length of the channel, can have a bottom at a depth from the surface 211 that is less than the thickness of the workstation portion 210 at the location of the channel, and can be open at surface 211 to form an opening along a substantial portion of the channel. For example, opening 254 of channel 250 can extend longitudinally along the entire channel Unlike the relatively simpler channels depicted above, each of channels 240 and 250 can also form a cross-section having an undercut that is defined by one width at the opening along surface 211 and a greater width at the bottom of the channel. This undercut geometry can result in each channel having ledges or upper regions that are configured to hold a cable therein regardless of orientation, which orientation can include while the channel opening facing downward, without the cable falling out due to gravity.

As one example, channels 240 and 250 can have a dovetail type undercut cross-section, as detailed below. Each of channels 240 and 250 can have multiple curved regions 241, 251, with channel 240 changing direction about four times and channel 250 changing direction about seven times. More or fewer curved portions and/or direction changes may also be utilized for a given channel Although channels 240 and 250 are shown as having about the same widths for purposes of illustration, it will be appreciated that these channels might also have different widths, such that different types and sizes of cables can be properly managed.

As shown, a power cable 220 having a plug 225 at one end has been installed into and is held by channel 250. Since the power cable 220 is flexible, it can conform to the longitudinal shape of channel 250. The power cable 220 is held in channel 250 regardless of the orientation of workstation portion 210 due to the undercut geometry of the channel. For example, power cable 220 is held in place even when workstation portion 210 is oriented with working surface 212 facing upward and surface 211 having channels 240 and 250 facing downward. The undercut nature of channel 250 can result in ledges or upper regions of the channel that hold cable 220 in the channel by supporting the cable at multiple locations, which may not necessarily be all locations along the length of the cable. For example, cable 220 can be pushed toward the sidewalls of channel 250 at multiple convex regions 255 of the curving channel. The undercut ledges or narrowed upper regions of the channel 250 at these convex regions 255 then hold the cable 220 within the channel even though the cable may not necessarily contact the channel sidewalls.

Additionally, as shown in FIG. 5B, a power cable 220 can be held in place in channel 240 such that cable can rest on the ledges of the channel, or by friction forces of the sidewalls of the channel, or both. In this example, not every portion of the power cable needs to be pushed against the walls of the channel to hold the power cable 220 in place by friction forces. In one example, contact between the power cable and the channel at a few convex regions, such as 255, is sufficient to hold the power cable in place, particularly, when there is no undercut that serve as a ledge portion of the channel.

Figure 6A:
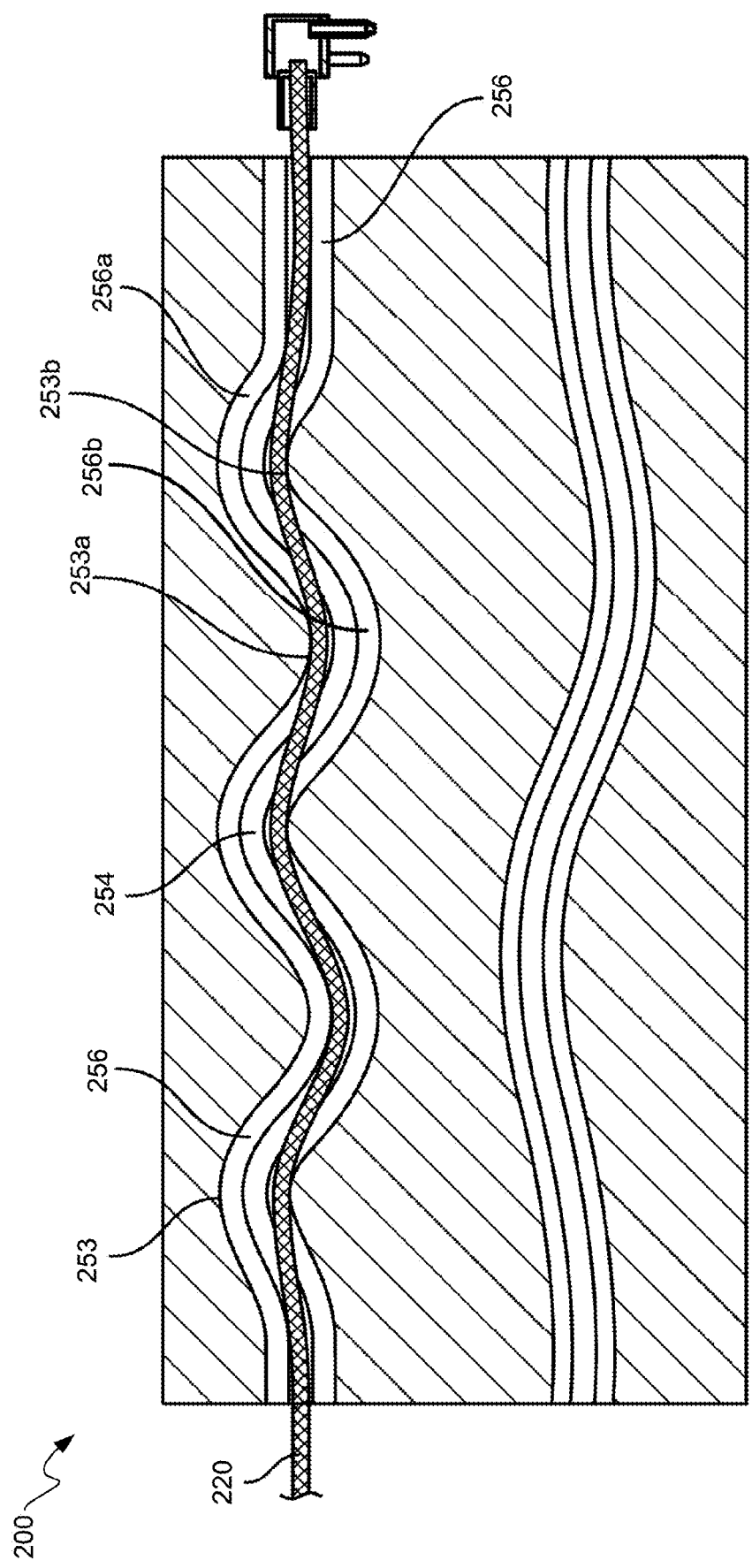
FIG. 6A illustrates in bottom cross-sectional view the exemplary workstation portion of FIG. 5A with a cable pulled taut within a channel according to one embodiment of the present disclosure.
Figure 6B:
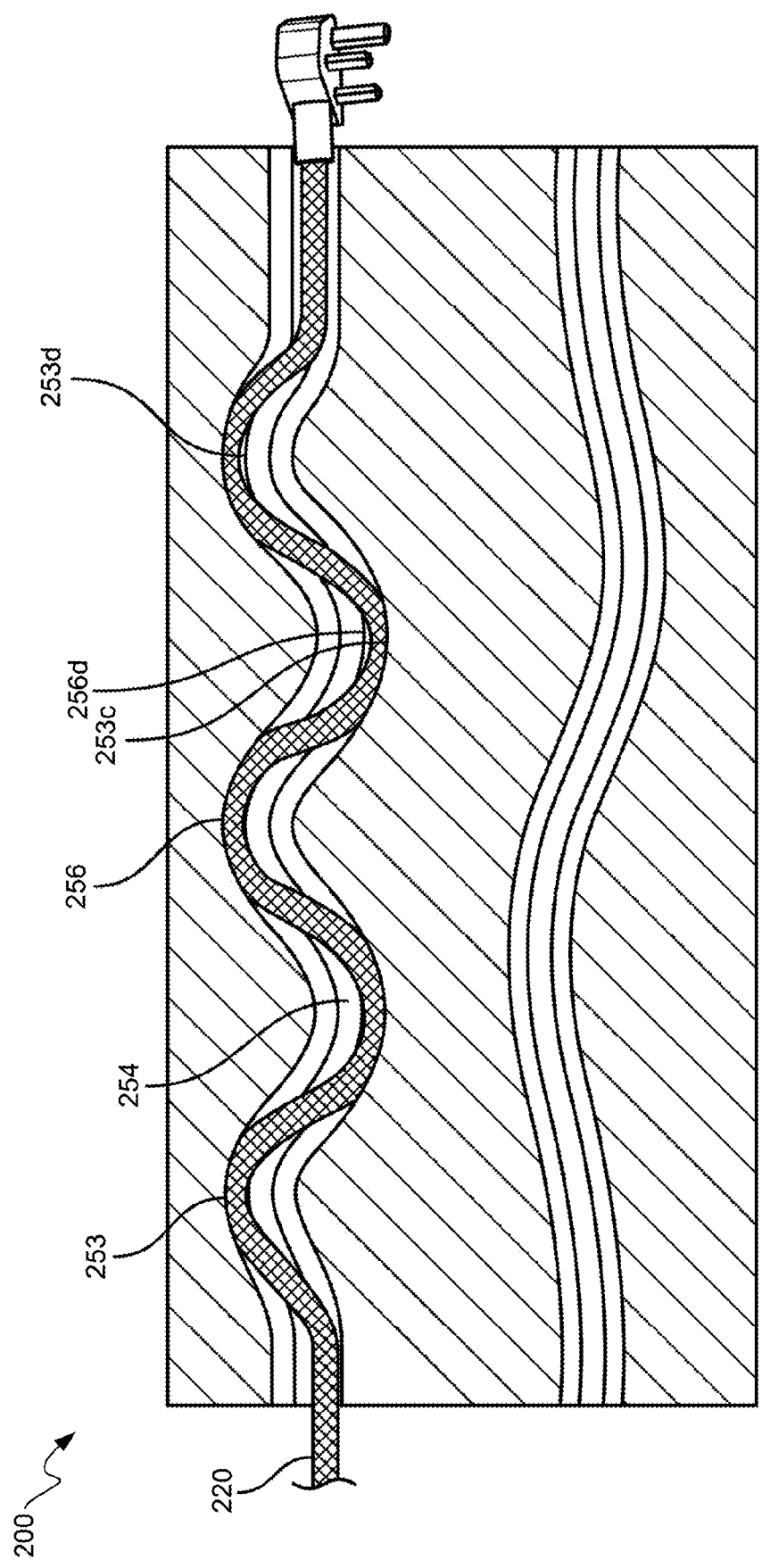
FIG. 6B illustrates in bottom cross-sectional view the exemplary workstation portion of FIG. 5A with a cable longitudinally compressed within a channel according to one embodiment of the present disclosure.

Cable 220 can be held within channel 250 despite being supported only at some undercut locations and not others along the length of the cable. This can occur in different ways, examples of which are shown in the bottom cross-sectional views of FIGS. 6A and 6B. FIG. 6A illustrates the exemplary workstation portion of FIG. 5A with a cable being pulled taut within a channel, while FIG. 6B depicts the cable being longitudinally compressed within the channel. As shown in FIG. 6A, power cable 220 can be pulled taut and held within channel 250 despite this channel having an opening 254 that runs longitudinally along the length of channel. Cable 220 can have a diameter that is less than the width of channel opening 254, such that the cable can initially be readily inserted into the channel 250 along its length. Due to the geometry of channel 250, which can have a T-slot type of undercut (such as that which is shown in FIG. 8B below), ledges 256 are formed on both sides of opening 254 along the length of the channel. As cable 220 is pulled fully taut or even somewhat taut after insertion into channel 250, this cable will then traverse the various curves and directional changes in channel 250 such that it is alternatingly supported by ledges 256 on both sides of the opening 254 depending upon where the cable is at a particular location in the channel. For example, cable 220 can be supported by ledge portion 256a at one location along channel 250 and then traverse opening 254 within the channel to be supported by the opposite ledge at ledge portion 256b at a further location along the channel. This support from opposing ledges 256 can then alternate as the channel 250 curves and changes directions along its length.

In addition to being supported by ledges 256 along the length of channel 250, cable 220 may or may not also be supported due to frictional forces between the cable 220 and the sidewalls 253 of the channel 250. When installed within channel 250, cable 220 may contact and press against various portions along both sidewalls 253 of the channel. When cable 220 is pulled partially or fully taut within channel 250, these points of contact tend to be at the apex of the convex portions of the channel sidewalls 253. These points of contact between cable 220 and the sidewalls 253 of channel 250 then tend to be at sidewall portions 253a along one sidewall and at sidewall portions 253b along the opposite sidewall of channel 250. Although frictional forces may exist due to contact between the cable and the channel sidewalls, it is contemplated that such forces are not necessary for the cable to be supported by the undercut of the channel alone.

As shown in FIG. 6B, power cable 220 can be longitudinally compressed and again still held within channel 250 despite this channel having an opening 254 that runs longitudinally along the length of channel Because cable 220 is compressed within the channel 250 rather than pulled taut, however, the actual portions of the ledges 256 that support the cable can be different than those where the cable is pulled taut. For example, longitudinally compressed cable 220 can be supported by ledge portion 256c at one location along channel 250 and then traverse opening 254 within the channel to be supported by the opposite ledge at ledge portion 256d at a further location along the channel 250. As in the foregoing example, this support from opposing ledges 256 can then alternate as the channel 250 curves and changes directions along its length.

In addition to being supported by ledges 256 along the length of channel 250, longitudinally compressed cable 220 can also be supported due to frictional forces between the cable and the sidewalls 253 of the channel 250. When cable 220 is longitudinally compressed partially or fully within channel 250, these points of contact tend to be at the apex of the concave portions of the channel sidewalls 253. These points of contact between cable 220 and the sidewalls 253 of channel 250 then tend to be at sidewall portions 253c along one sidewall and at sidewall portions 253d along the opposite sidewall of channel 250. Again, while frictional forces may exist due to contact between the cable and the channel sidewalls, it is contemplated that such forces are not necessary for the cable to be supported by the undercut of the channel alone.

Figure 7:
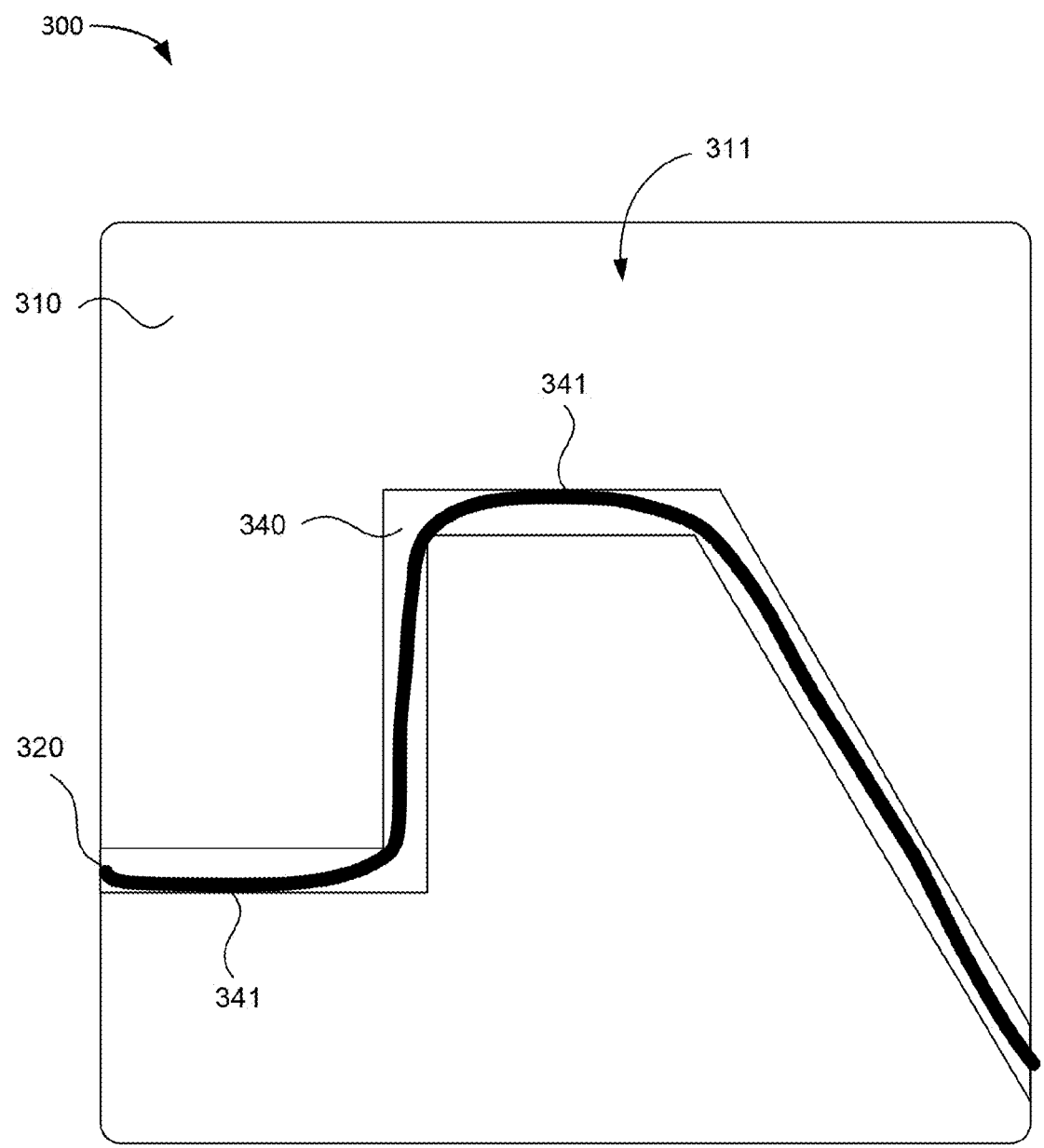
FIG. 7 illustrates in top plan view an exemplary workstation portion having a non-curving channel and a cable held therein according to one embodiment of the present disclosure.

Continuing with FIG. 7, an exemplary workstation portion having a non-curving channel and a cable held therein is illustrated in top plan view. Workstation arrangement 300 can involve a desk, table, or other item where cables are commonly used. Workstation portion 310 can be all or part of an upper component of the workstation and can include a surface 311 having a channel 340 integrally formed therein. As shown, channel 340 can have multiple straight portions, multiple directional changes, and no curved regions. Because channel 340 changes directions multiple times, a cable 320 installed within the channel 340 can be held within the channel regardless of the channel orientation. Cable 320 can be held within channel 340 due to ledges or other undercut regions along the length of the channel, due to frictional forces between the cable and the channel sidewalls, or both. For example, frictional forces may exist at locations 341 along the channel 340 where the cable 320 is forced against the channel sidewalls, since the cable is forced to curve within the channel even though channel 340 has no curved regions itself.

Figure 8A:
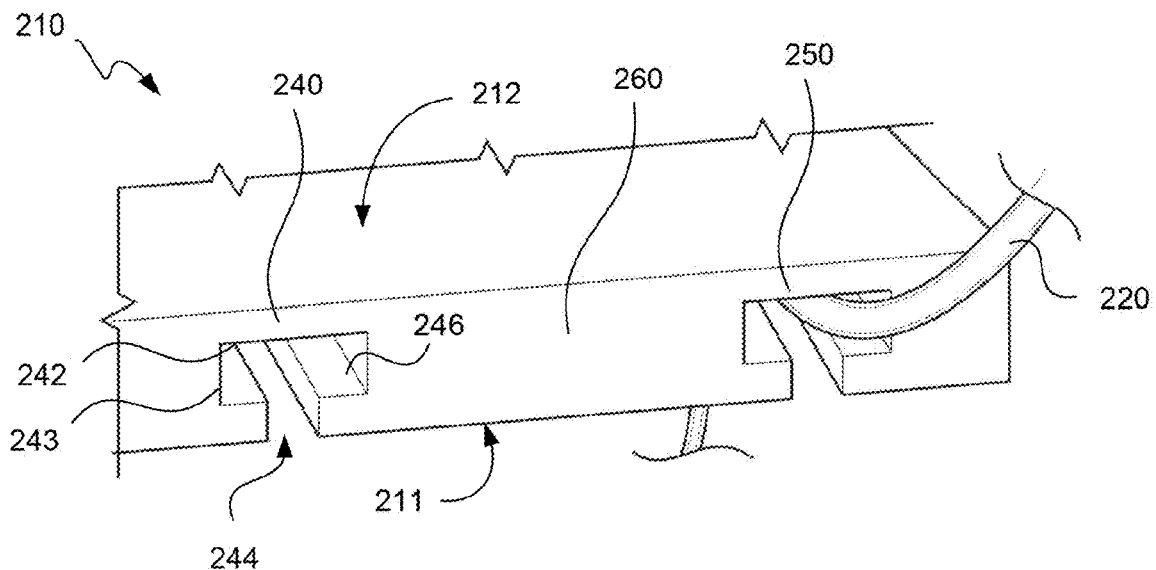
FIG. 8A illustrates in side perspective cross-sectional view an exemplary workstation portion holding a cable therein according to one embodiment of the present disclosure.
Figure 8B:
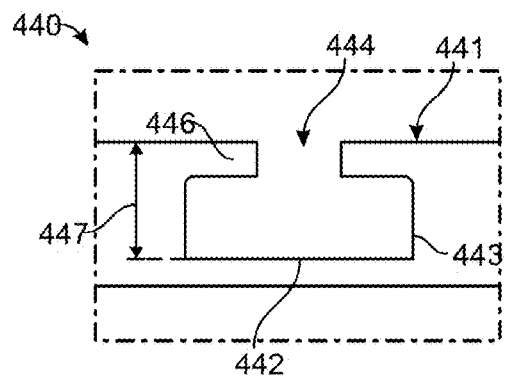
FIGS. 8B-8D illustrate in side cross-sectional views the geometries of different exemplary workstation channels according to various embodiments of the present disclosure.

Turning next to FIG. 8A, an exemplary workstation portion holding a cable therein is shown in side perspective cross-sectional view. As shown, workstation portion 210 is oriented such that working surface 212 is facing upward and the opposing channel bearing surface 211 is facing downward. First channel 240 and second channel 250 both end at a side 260 of workstation portion 210, such that the cross-sections of these channels can be seen at side 260. Power cable 220 extends from the end of second channel 250 at the side 260 of workstation portion 210. The cross-sections of each of channels 240 and 250 is effectively a "T-slot" type of cross-section, such that the width of the channel at its bottom is greater than the width of the channel at its opening. For example, the width of first channel 240 at its bottom 242 is greater than the width at its opening 244 that is located along surface 211 of workstation portion 210. Channel 240 can also have sidewalls 243 and ledge portions 246 that are formed by the T-slot type undercut. This cross-section can remain the same across all or a significant portion of the longitudinal length of each channel, and results in channels 240 and 250 both having an undercut type of geometry along the portions of their longitudinal lengths having this type of cross-section.

Figure 8C:
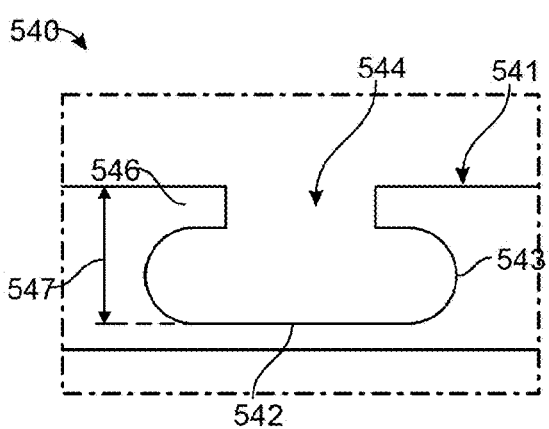
Figure 8D:
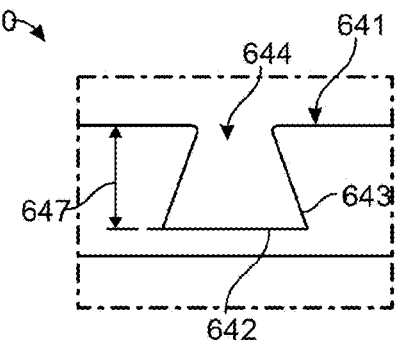

Although a T-slot type of undercut is shown for the channels of FIG. 8A, it will be appreciated that most any form of undercut geometry may similarly be used to hold installed cables in place regardless of the orientation of workstation portion 210. FIGS. 8B-8D illustrate in side cross-sectional views exemplary geometries of different workstation channels according to various embodiments of the present disclosure. FIG. 8B depicts a channel having a T-slot geometry, such as that which is shown in the foregoing examples. Channel 440 can have an opening 444 at a surface 441 of its respective workstation component or other relevant item. Channel 440 can also have a bottom 442 at a depth 447 from the surface 441 that is less than the workstation thickness where the channel 440 is located, as well as sidewalls 443 that extend along the length of the channel Ledges 446 formed by the T-slot geometry can serve to help support a cable that has been inserted or installed into the channel 440 through the opening 444. As noted above, additional cable support may be provided by frictional forces between the cable and one or both sidewalls 443, such as at locations where channel 440 curves or otherwise changes directions and the cable hence presses against the sidewalls 443.

FIG. 8C depicts a channel having a canoe bit geometry, which is similar to the T-slot geometry only with rounded internal corners. Channel 540 can similarly have an opening 544 at surface 541 of its respective workstation component, a bottom 542 at a depth 547 from the surface 541, as well as sidewalls 543 and ledges 546 formed by the canoe bit geometry. Again, a cable installed into channel 540 can be supported from falling out of the channel by ledges 546, by frictional forces between the cable and sidewalls 543, or by both. FIG. 8D depicts a channel having a dovetail geometry, which is simpler than the T-slot and canoe bit geometries above, but still retains an undercut profile. Channel 640 can similarly have an opening 644 at surface 641 of its respective workstation component, a bottom 642 at a depth 647 from the surface 641, as well as sidewalls 643. A cable installed into channel 640 might be supported from falling out of the channel by the undercut nature of the dovetail but can be better supported by frictional forces between the cable and sidewalls 643. Other channel cross-sectional geometries are also contemplated for use with the disclosed systems, particularly any geometry that involves an undercut.

Various processes and techniques can be used to create the disclosed channels that are integrally formed with their respective desks, tables, workstations, or other relevant devices or items. In some embodiments, a computer numerical control ("CNC") drill or other similar machinery can be used to form a channel within a solid piece of material, such as a wood or metal desk component. A CNC drill can be fitted with a T-slot bit, a canoe bit, a dovetail bit, or any other suitable bit to create the desired channel Other types of machinery may also be used to create such channels having undercut profiles. In other embodiments, one or more channels can be formed by gluing or otherwise fastening layers of material on top of each other. For example, a first layer of material defining the sidewalls of one or more channels can be fastened atop a base layer that is solid and unbroken. A second layer of material defining the opening of the channel at the surface can then be fastened atop the first layer to form one or more channels having undercut profiles. Other suitable formation processes and techniques may also be used.

Figure 9:
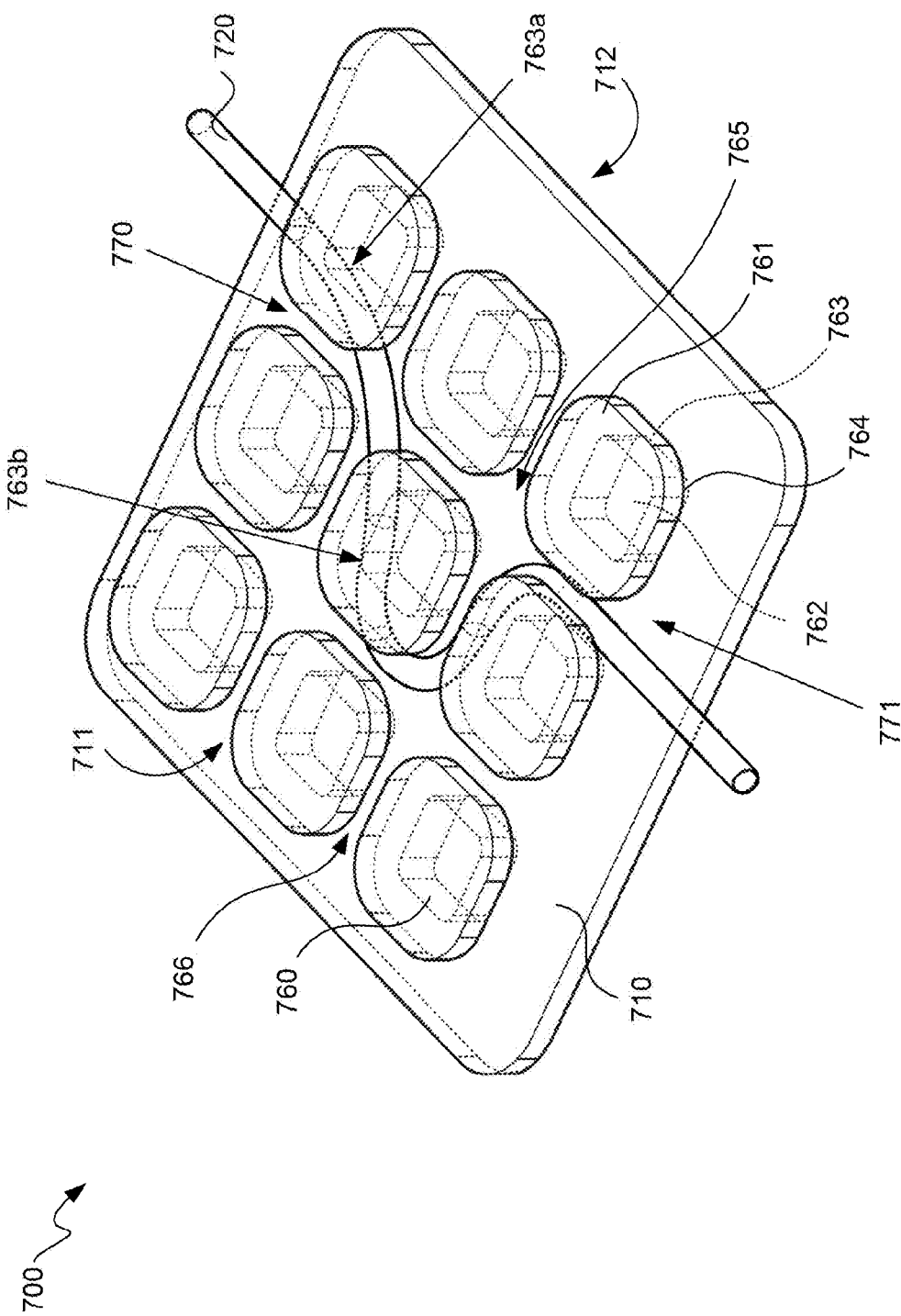
FIG. 9 illustrates in bottom perspective view an exemplary workstation portion having a plurality of individual notches with an undercut and a curving cable held within the workstation portion by friction forces according to one embodiment of the present disclosure.

Transitioning now to FIG. 9, an exemplary workstation portion having a plurality of individual notches with an undercut and a curving cable held within the workstation portion by friction forces is illustrated in bottom perspective view. Workstation arrangement 700 can include a workstation portion 710 that may be part of a desk, table, or other relevant item within a working environment where cables are typically used. As such, workstation portion 710 can have a cable bearing surface 711 and an upper surface 712 that may be substantially flat and unbroken or otherwise suitable for work. Rather than having continuous isolated integrally formed at cable bearing surface 711, a plurality of notches 760 can be formed at surface 711. These notches 760 can be used to hold cables to the workstation portion 710 in a variety of configurations. While nine notches 760 arranged into a 3×3 grid formation are shown as being formed on workstation portion 710, it will be understood that more or fewer notches may be used, and that such notches can be arranged in any manner as desired.

Each of notches 760 can include an upper region 761 having a first width and a lower region 762 having a second width that is less than the first width. Although it may be possible to use a single notch 760 to hold a cable in place, it is specifically contemplated that one or more cables may be held in place simultaneously using multiple notches in cooperation with each other. For example, cable 720 is shown as being routed through and contacting at least three notches 760 on workstation portion 710. When used in combination, the plurality of notches 760 can effectively form a virtually infinite number of channels or routing paths for cables at surface 711. In the specific example shown in FIG. 9, it can be seen that at least 100 different simple channels or routing paths can be used to route cable 720 from entry point 770 through the matrix of notches 760 in a variety of different ways to arrive at exit point 771. Of course, thousands or even millions of routing paths may also be had if cable 720 is routed through the matrix of notches 760 in a lengthy and complex manner with many twists and turns.

Although continuous isolated channels are not formed in workstation portion 710 as in the foregoing examples, the wide variety of routing paths through the matrix of notches 760 can be considered channels with channel sidewalls and ledges, as well as channel intersections 765 in this case. Because each notch has a lower region 762 having a smaller width than the upper region 761, channel sidewalls 763 can effectively be formed along the sides of the lower regions 762, and ledges 764 can be formed at the extending portions of the upper regions 761. Similar to the foregoing embodiments, cables can be held within the various channels formed by notches 760 due to friction forces between the cables and sidewalls 763, due to support from ledges 764, or some combination of both. Channel "openings" 766 can then also be considered to be the spacing between the upper regions 761 of adjacent notches 760. Accordingly, the plurality of individual notches 760 combine to form hundreds or even millions of possible channels depending on the cable routing paths used for workstation portion 710.

As shown in FIG. 9, cable 720 can be held in place by notches 760 due to the curved portions of the cable having potential elastic energy that causes friction forces against the sidewalls 763 of some of the notches 760 as the cable 720 tries to straighten out where it contacts these sidewalls. For example, friction forces can occur where cable 720 is curved and trying to expand up against sidewalls at 763a, 763b, and 763c within the matrix of notches 760.

Additionally, a cable that is pulled taut and held within workstation portion 710 by undercut ledges 764 of the notches can provide support. Again, multiple cables may be held within the notches of workstation portion 710, and each cable may be held by friction forces against sidewalls 763, by undercut ledges 764, or some combination of both. For example, not all cables need to be curved in this configuration to be held in place. One or more cables can be held in place due to the ledge portions of each individual notch holding a portion of the power cable as the power cable rests on the ledges.

Figure 10:
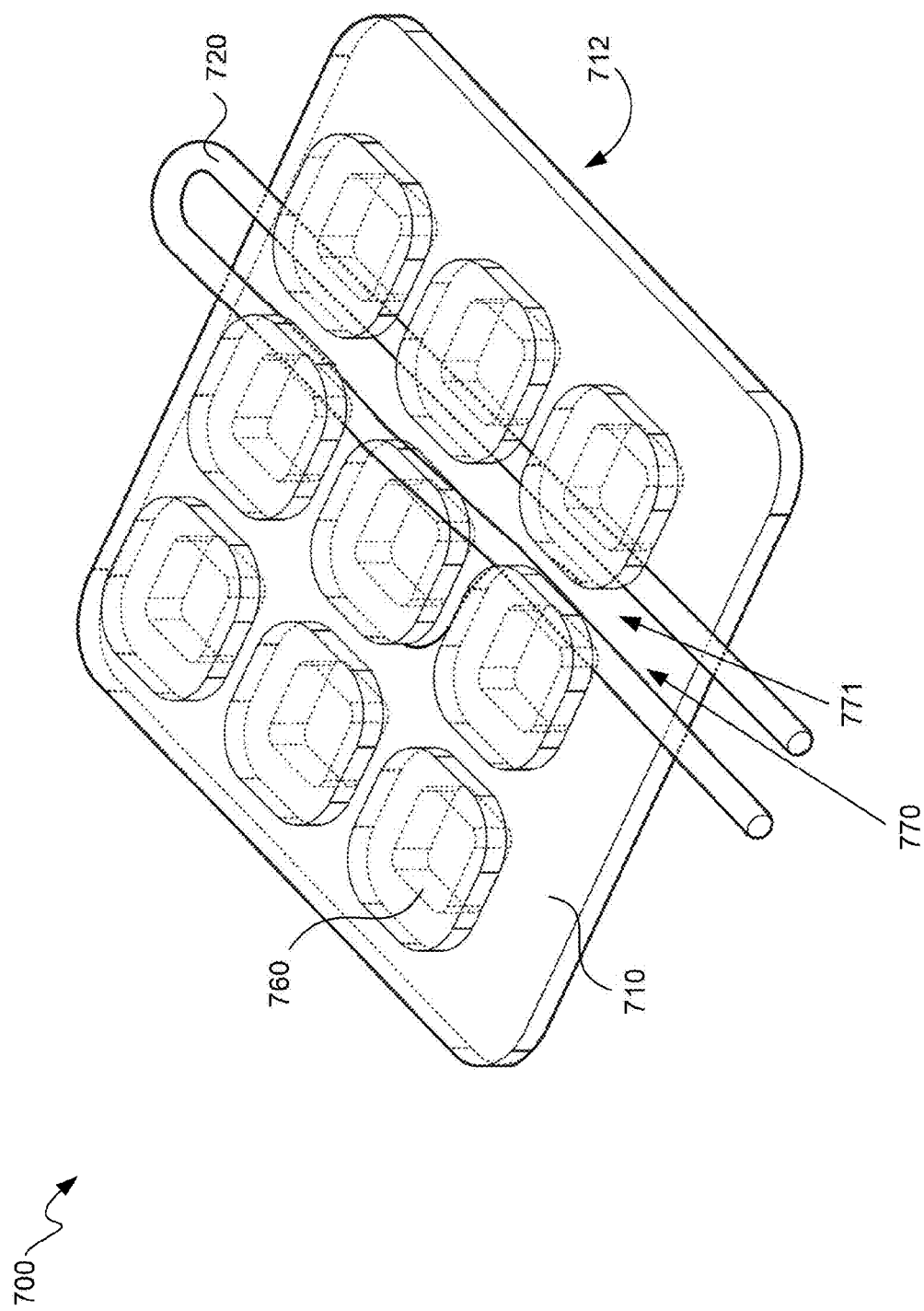
FIG. 10 illustrates in bottom perspective view the exemplary workstation portion having a plurality of individual notches with an undercut and a curving cable held within the workstation portion by friction forces according to one embodiment of the present disclosure.

FIG. 10 depicts a workstation arrangement 700 having a cable that is curved only at one portion of the cable is effectively folded so that two portions of the same cable are extending along the same axis, and held in place by the workstation having a plurality of channels made of a plurality of notches. In this example, the notches provide support by a ledge portion that can support one or more cable or cable portions placed in the channels. Additionally, frictions forces experienced by the cables due to the cables' elastic potential energy from being curved and expanding and extending to a straight cable, by pushing portions of the cable against one or more walls of one or more individual notches of the plurality of notches will hold the one or more cables in place. For example, a cable can be inserted into workstation portion 710 through one opening 770 and one exit 771. In this example, the opening, and the exiting portion of the channel created by the notches are the same. The cable 720 can be inserted into the channel, curved at one portion, and then extended back out of the same place as the cable was inserted.

Figure 11A:
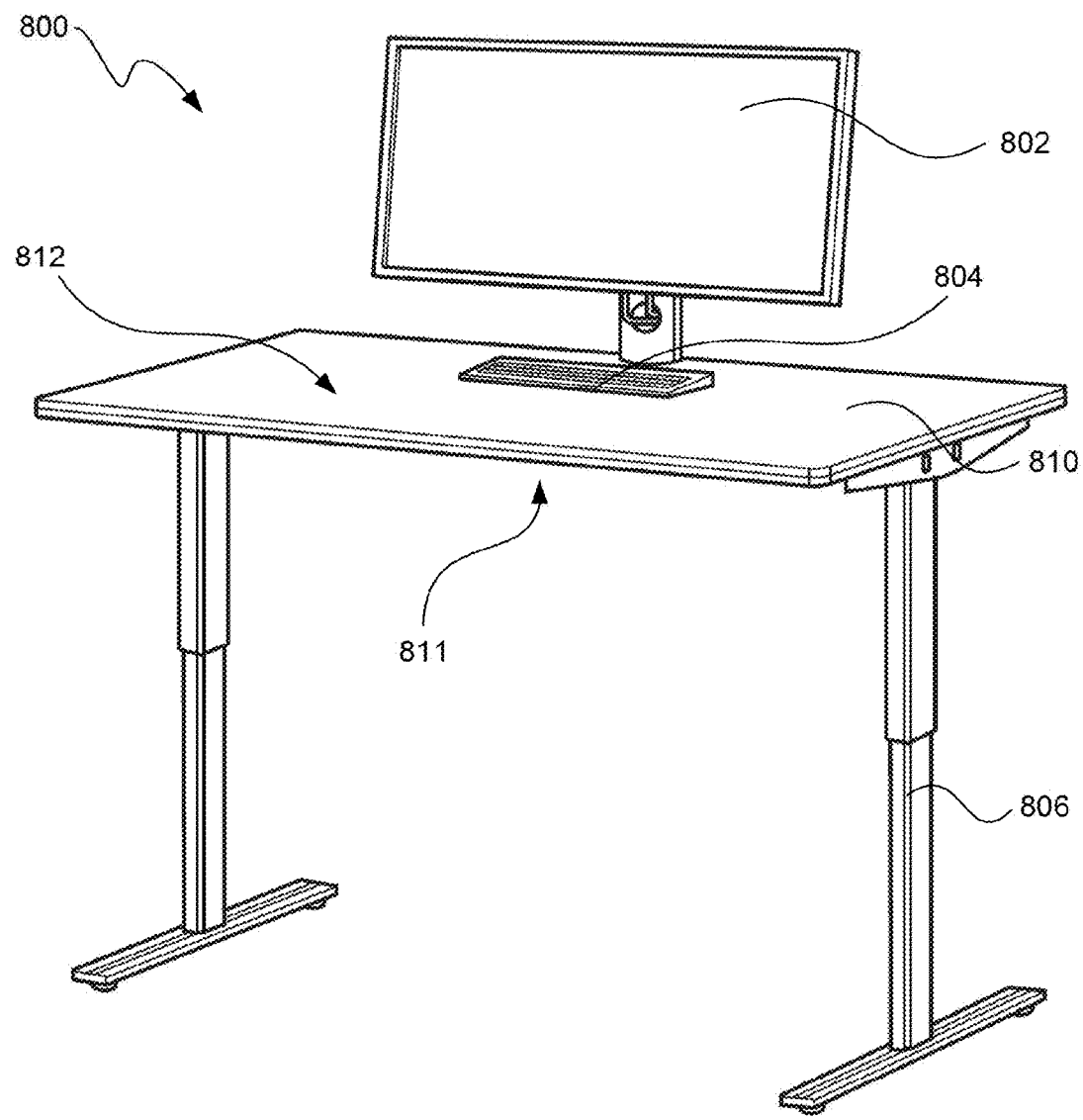
FIG. 11A illustrates in front perspective view an exemplary desk according to one embodiment of the present disclosure.
Figure 11B:
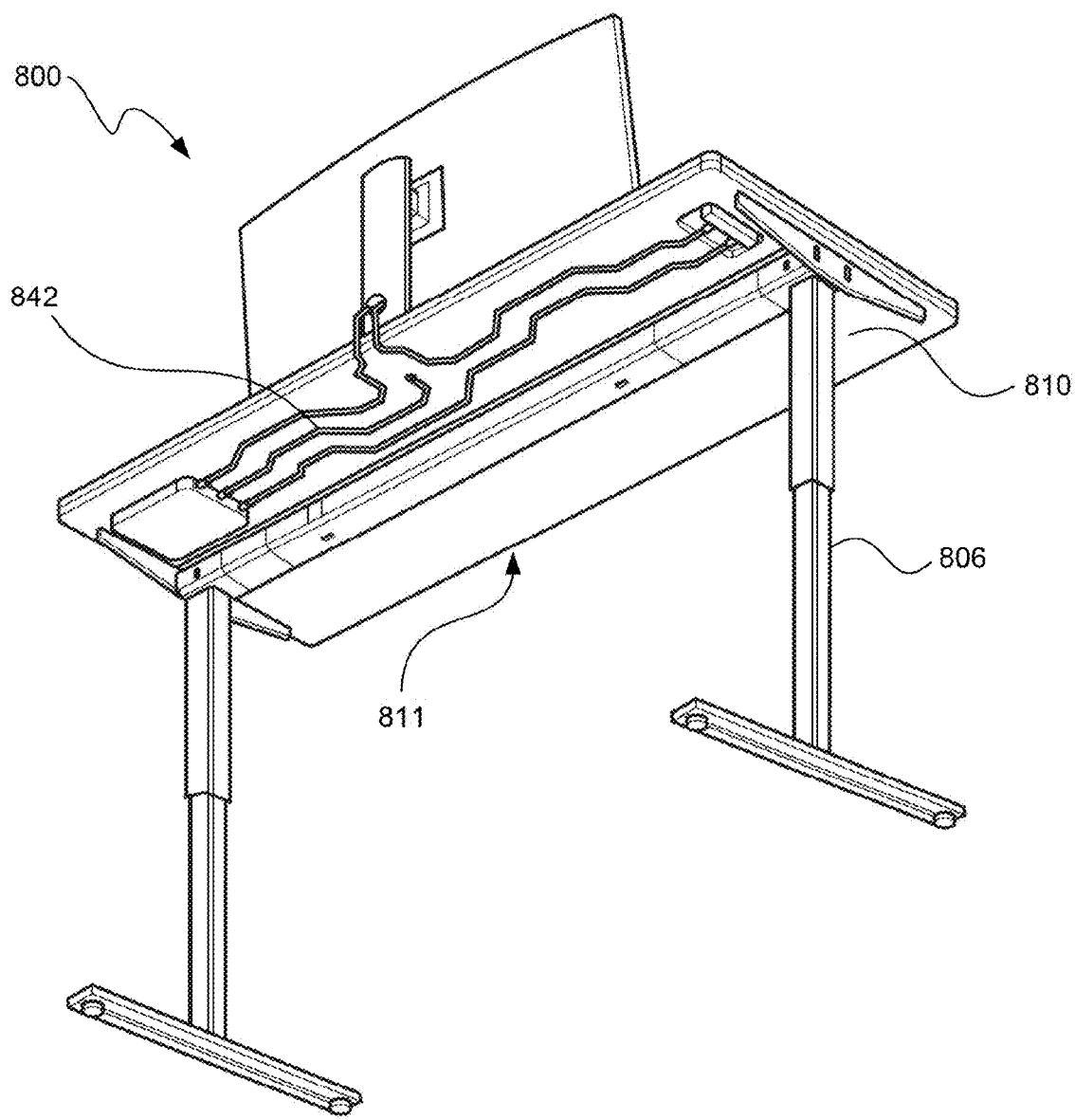
FIG. 11B illustrates in rear bottom perspective view the exemplary desk of FIG. 11A according to one embodiment of the present disclosure.

As a specific non-limiting example, FIGS. 11A and 11B illustrate an exemplary desk in front perspective and rear bottom perspective views respectively. Desk 800 can resemble a typical desk used in a home or office setting and can generally support a number of unrelated working items that utilize cables, such as a computer monitor 802 and keyboard 804. Desk 800 can include one or more support members 806, such as legs, and can have an upper component 810, such as a tabletop portion, coupled to and supported by these support members 806. The upper component 810 can include a first surface 812 that may be a substantially flat and unbroken working surface, and this first surface 812 can support the monitor 802, keyboard 804, and various other items. Upper component 810 can also include a second surface 811 that is separate from working surface 812, such as at an underside of the desk that is opposite the working surface 812. This second surface 811 can include one or more channels 840 integrally formed therein, with these channels being adapted to manage the cables of the monitor 802, keyboard 804, and/or any other cable bearing component located atop or at desk 800.

Figure 11C:
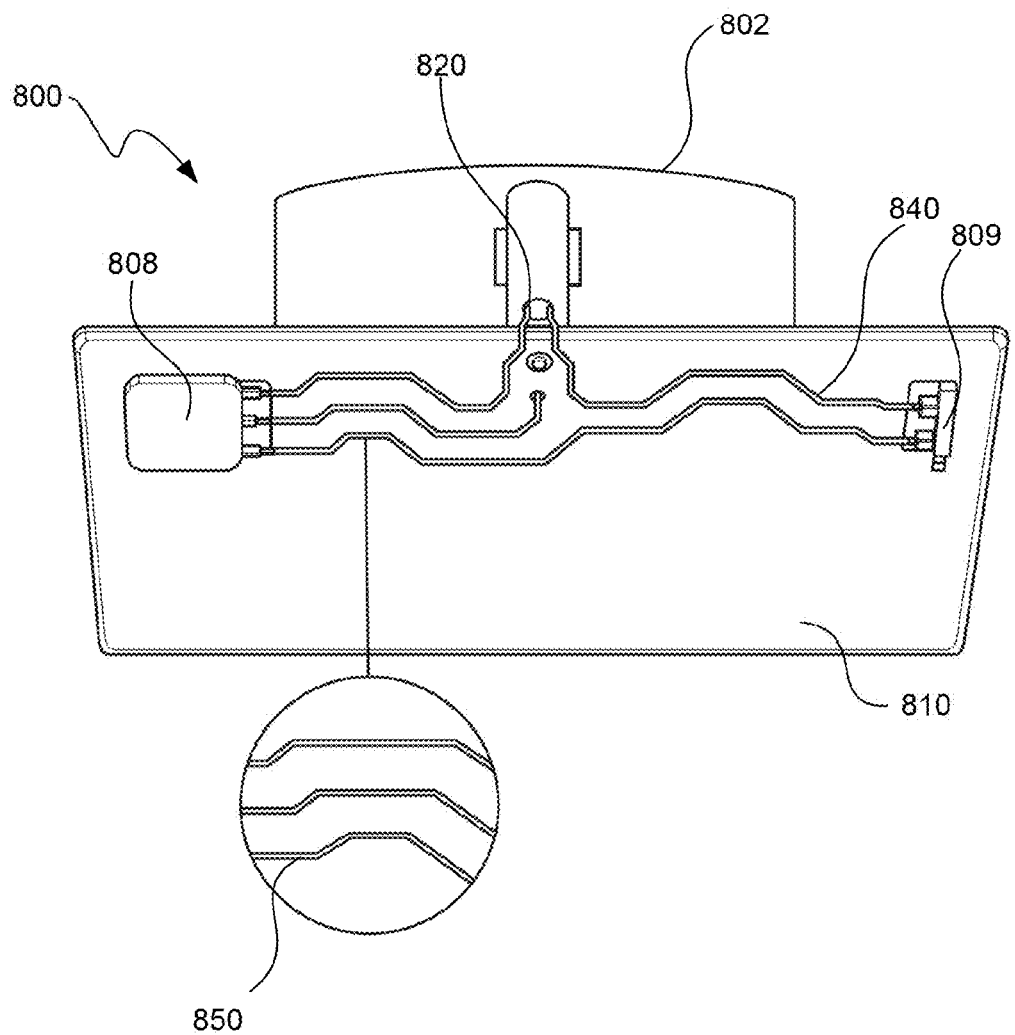
FIG. 11C illustrates in rear bottom perspective view an underside region of the exemplary desk of FIG. 11A according to one embodiment of the present disclosure.

FIG. 11C illustrates in rear bottom perspective view an underside region of the exemplary desk of FIG. 11A according to one embodiment of the present disclosure. Cables 820 can be routed from the back of monitor 802 into the channels 840 that are integrally formed within upper component 810 in a manner such as any of the foregoing embodiments. Cables 820 can then proceed through channels 840 to a computing component 808, power source 809, and/or various other components located at or about upper component 810 of desk 800. Further channels may also exist at upper component 810, such as, for example, a channel 850 configured to route a power cable from a computing component 808 to power source 809. Although channels 840 and 850 may be curved, it is also contemplated that these channels can include only straight portions with directional changes, as noted above.

Figure 12:
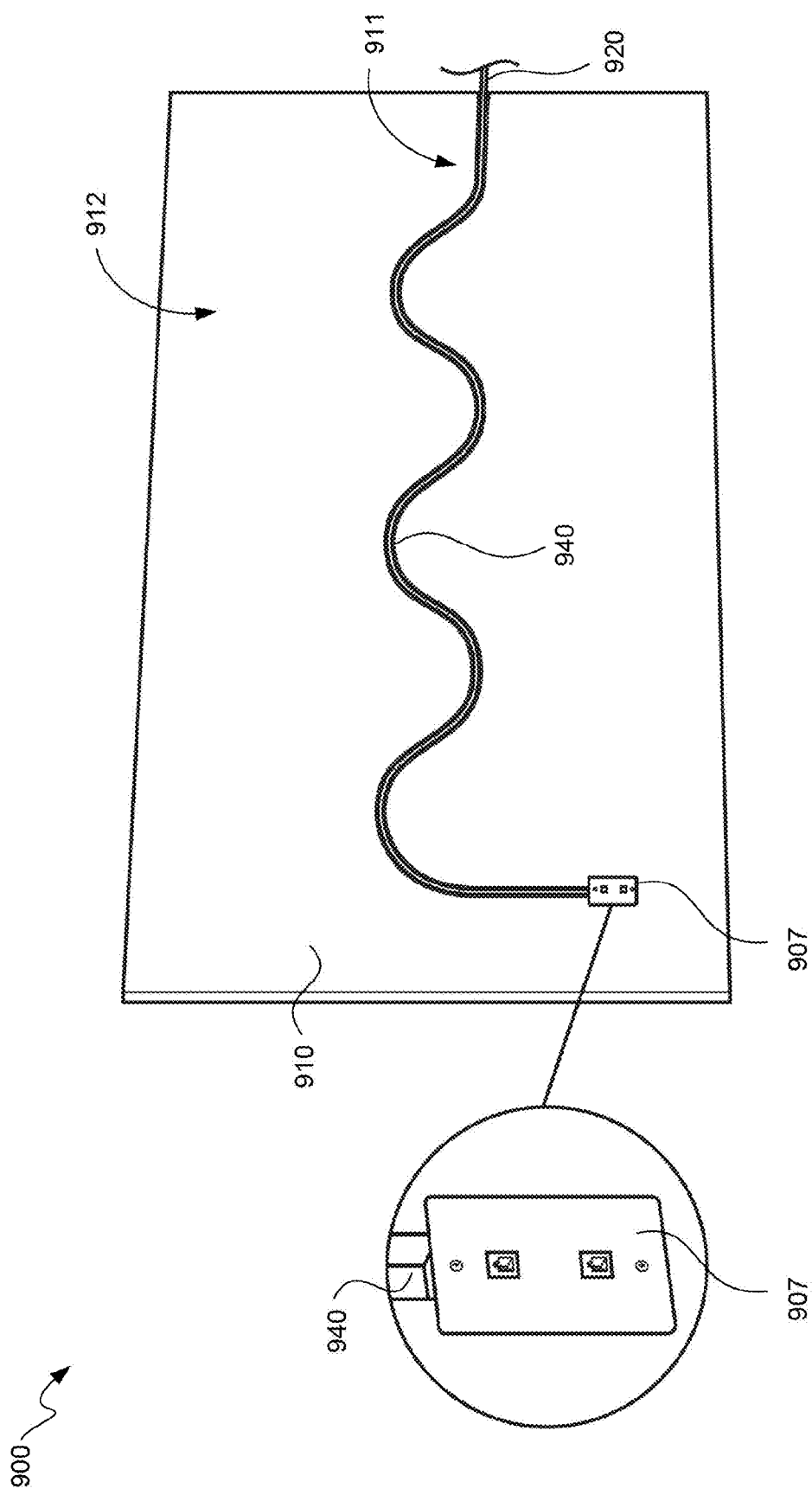
FIG. 12 illustrates in front perspective view an exemplary wall having a curving channel and a curving cable held therein by friction forces according to one embodiment of the present disclosure.

Turning lastly to FIG. 12, an exemplary wall having a curving channel and a curving cable held therein by friction forces is shown in front perspective view. Wall arrangement 900 can include a wall portion 910 that can be vertically oriented and can include a curving channel 940 integrally formed within the material of the wall at a first surface 911 of the wall. Although not necessary, a second surface 912 of the wall can be substantially flat and unbroken, and can be separate from the first surface 911. A cable 920 can be curved and held within the curving channel 940, such as through the use of friction forces resulting from elastic potential energy in the cable as the cable tries to straighten at the places where it is curved in the channel. Channel 940 may end at a wall outlet 907, socket, or other item that may be used for coupling outside cables or cords to the cable 920 held within the wall portion 910.

Although the foregoing disclosure has been described in detail by way of illustration and example for purposes of clarity and understanding, it will be recognized that the above described disclosure may be embodied in numerous other specific variations and embodiments without departing from the spirit or essential characteristics of the disclosure. Certain changes and modifications may be practiced, and it is understood that the disclosure is not to be limited by the foregoing details, but rather is to be defined by the scope of the appended claims.

What is claimed is:

1. An apparatus, comprising:
   a first surface configured for working; and
   a second surface separate from the first surface and having a channel integrally formed into a material of the apparatus at the second surface, the channel having sidewalls and extending longitudinally in a direction that is parallel to the second surface and having a longitudinal channel opening at the second surface along a substantial portion of the channel, wherein the channel is configured to hold a cable therein and wherein friction force between the cable and the channel sidewalls holds the cable in place within the channel.

2. The apparatus of claim 1, wherein the cable is curved within the channel and the friction force results from elastic potential energy in the curved cable pushing the cable outward against one or more of the channel sidewalls.

3. The apparatus of claim 1, wherein the channel changes direction multiple times along a length of the channel.

4. The apparatus of claim 1, wherein the channel includes at least one curved portion along a length of the channel.

5. The apparatus of claim 1, wherein the channel is configured to hold the cable therein while the channel opening faces downward without the cable falling out due to gravity.

6. The apparatus of claim 1, wherein the channel forms a cross-section having an undercut that is defined by ledge portions at the channel opening, and wherein the cable is held in the channel at least in part by the ledge portions.

7. The apparatus of claim 1, wherein the first surface is a top surface and the second surface is a bottom surface opposite the top surface.

8. The apparatus of claim 1, wherein the first surface is substantially flat and unbroken.

9. The apparatus of claim 1, wherein the apparatus comprises at least a portion of a desk.

10. An apparatus, comprising:
    a first surface configured for working; and
    a second surface separate from the first surface and having a plurality of channels integrally coupled to the apparatus at the second surface, each of the plurality of channels comprised of a plurality of notches forming the plurality of channels, each notch of the plurality of notches having sidewalls, wherein the plurality of notches are configured to hold simultaneously a plurality of cables therein.

11. The apparatus of claim 10, wherein the plurality of channels intersect at a plurality of channel intersections.

12. The apparatus of claim 11, wherein there are at least one hundred possible paths for a single cable to traverse through the plurality of channels.

13. The apparatus of claim 12, wherein the plurality of individual notches combine to form the plurality of channels.

14. The apparatus of claim 13, wherein each of the plurality of individual notches defines an upper region having a first width and a lower region having a second width that is less than the first width.

15. The apparatus of claim 14, wherein the lower regions of the individual notches form the channel sidewalls and the upper regions of the individual notches form ledge portions.

16. The apparatus of claim 15, wherein at least one cable of the plurality of cables is held in the plurality of channels at least in part by the ledge portions.

17. The apparatus of claim 10, wherein friction force between at least one cable of the plurality of cables and the channel sidewalls holds the at least one cable in place within the plurality of channels.

18. An apparatus, comprising:
    a first surface configured for working; and
    a second surface separate from the first surface and having a channel integrally formed thereat, wherein the channel:
    extends longitudinally through the apparatus in a direction that is parallel to the second surface,
    has sidewalls along a length of the channel,
    has a bottom at a depth from the second surface that is less than the thickness of the apparatus at the location of the channel,
    is open at the second surface to form an opening along a substantial portion of the channel, and
    is configured to hold a cable therein by way of a friction force between the cable and the channel sidewalls.

19. The apparatus of claim 18, wherein the channel forms a cross-section having an undercut that is defined by a first width at the opening along the second surface and a second width at the bottom of the channel, with the second width being larger than the first width.

20. An apparatus, comprising:
    a first surface configured for working; and
    a second surface separate from the first surface and having a channel integrally formed into a material of the apparatus at the second surface, the channel having sidewalls and extending longitudinally in a direction that is parallel to the second surface and having a longitudinal channel opening at the second surface along a substantial portion of the channel, wherein the channel is configured to hold a cable therein and wherein the channel includes at least one curved portion along a length of the channel.

* * * * *